US00RE36531E

United States Patent [19]

Kuriyama et al.

[11] E Patent Number: Re. 36,531

[45] Reissued Date of Patent: Jan. 25, 2000

[54] SEMICONDUCTOR MEMORY DEVICE INCLUDING MEMORY CELLS CONNECTED TO A GROUND LINE

[75] Inventors: Hirotada Kuriyama; Yoshio Kohno, both of Hyogo, Japan

[73] Assignee: Mitsubishi Denki Kabushiki Kaisha, Tokyo, Japan

[21] Appl. No.: 08/775,742

[22] Filed: Dec. 31, 1996

Related U.S. Patent Documents

Reissue of:

[64] Patent No.: 5,379,247
Issued: Jan. 3, 1995
Appl. No.: 08/126,765
Filed: Sep. 27, 1993

[30] Foreign Application Priority Data

Sep. 28, 1992 [JP] Japan ..... 4-257840

[51] Int. Cl.[7] ..... G11C 5/06

[52] U.S. Cl. ..... 365/63; 365/51

[58] Field of Search ..... 365/154, 156, 365/190; 257/385, 401, 758, 903, 904

[56] References Cited

U.S. PATENT DOCUMENTS

| | | | |
|---|---|---|---|
| 4,733,374 | 3/1988 | Furuyama et al. | 365/205 |
| 5,239,196 | 8/1993 | Ikeda et al. | 257/385 |
| 5,289,404 | 2/1994 | Okamoto | 365/63 |
| 5,291,053 | 3/1994 | Pfiester et al. | 257/393 |
| 5,436,506 | 7/1995 | Kim et al. | 257/347 |
| 5,455,787 | 10/1995 | Kawasima | 365/154 |
| 5,463,576 | 10/1995 | Kuriyama et al. | 365/63 |
| 5,596,212 | 1/1997 | Kuriyama | 257/298 |

FOREIGN PATENT DOCUMENTS

| | | | |
|---|---|---|---|
| 62188263 | 8/1986 | European Pat. Off. . | |
| 004186671 | 7/1992 | European Pat. Off. . | |
| 0 501 884 | 9/1992 | European Pat. Off. . | |
| 7-93364 | 10/1995 | Japan | H01L 27/10 |

OTHER PUBLICATIONS

Shuji Ikeda et al., "A Polysilicon Transistor Technology for Capacity SRAMs", International Electron Devices Meeting, San Francisco, Dec. 9–12, 1990, Institute of Electrical and Electronics Engineers, pp. 469–472, XP000279591.

Y. Kobayashi et al. "A IOuW Stanby Power 2.56K emos SRAM", IEEE Journal of Solid–State Circuits, vol. 20, No. 5, Oct. 1985, pp. 935–940.

D. Min et al. "Wordline Coupling Noise Reduction Techniques for Sealed DRAMs", 1990 Symposium on VLSI Circuits, Jun. 1990, pp. 81–82.

*Primary Examiner*—Son Mai
*Attorney, Agent, or Firm*—McDermott, Will & Emery

[57] ABSTRACT

A memory cell array in a static random access memory (SRAM) includes an improved circuit. Memory cells in one row are connected to a ground line. The memory cells in another row are connected to the ground line. Word lines each are connected alternately to the memory cells of two rows column by column. In a read operation, when one of the word lines is activated, a current flows from the memory cell to the two ground lines. Since a total of currents flowing through one ground line is reduced, the rise of potentials of the ground lines is prevented, so that destruction of data can be prevented.

34 Claims, 17 Drawing Sheets

FIG. 16 PRIOR ART
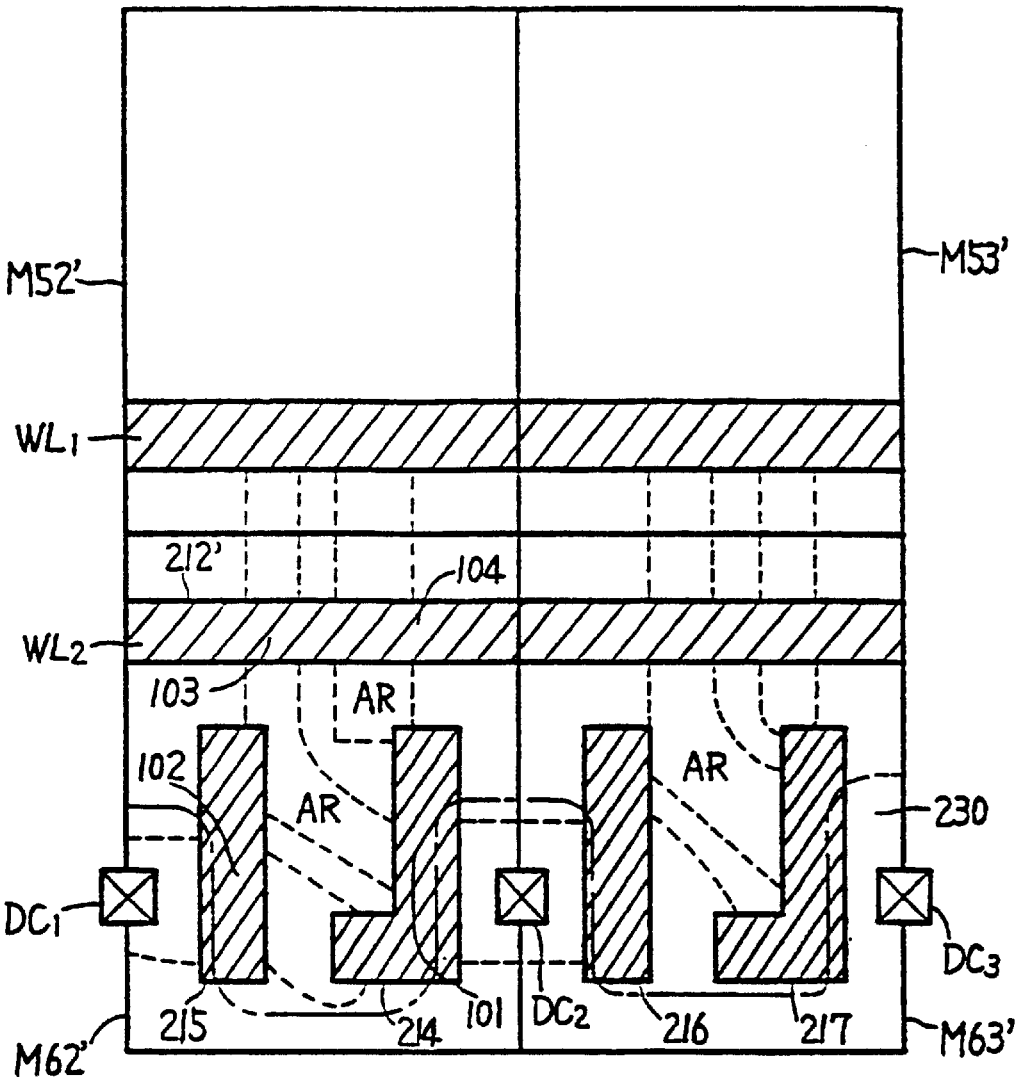
FIG. 17 PRIOR ART AMENDED
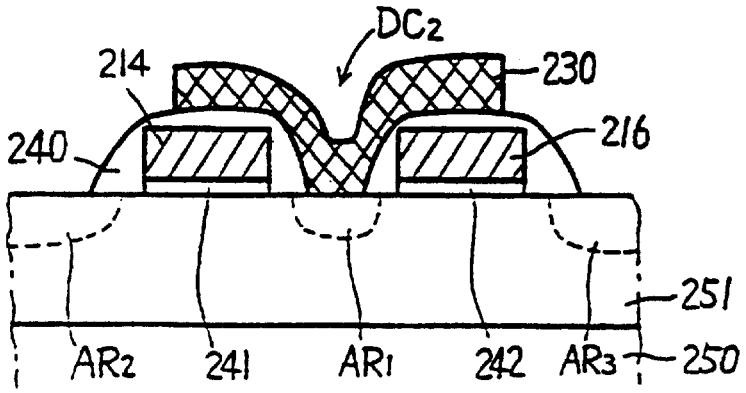

SEMICONDUCTOR MEMORY DEVICE INCLUDING MEMORY CELLS CONNECTED TO A GROUND LINE

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a semiconductor memory device, and in particular, to a semiconductor memory device including memory cells connected to a ground line. The present invention has particular applicability to a static random access memory (SRAM).

2. Description of the Background Art

In recent years, static random access memories (hereinafter referred to as "SRAMs") using thin film transistors (hereinafter referred to as "TFTs") have been developed and marketed to meet the requirements for higher degree of integration and low power consumption of semiconductor memory devices. An example of the SRAM using TFTs is disclosed in a paper entitled "A POLYSILICON TRANSISTOR TECHNOLOGY FOR LARGE CAPACITY SRAMs" (1990, International Electron Devices Meeting (IEDM), pp 469–472).

Although the invention can be generally applied to the semiconductor memories including memory cells connected to a ground line, an example in which the present invention is applied to the SRAM will be described hereinafter.

FIG. 13 is a block diagram of a conventional SRAM. Referring to FIG. 13, an SRAM 100 includes a memory cell array 1, an X decoder 2, a Y decoder 3, a sense amplifier 5, an output buffer 6, an input buffer 7 and a write circuit 8.

Memory cell array 1 includes a large number of memory cells MC disposed in rows and columns. In FIG. 13, each of memory cell groups 1r, 1r, . . . , arranged in a lateral direction is a row, and each of memory cell groups 1c, 1c, . . . ,arranged in a vertical direction is a column. X decoder 2 selects a row in memory cell array 1. Y decoder 3 selects a column in memory cell array 1. Sense amplifier 5 amplifies a data signal read out from the memory cell MC. Output buffer 6 provides the amplified data signal as output data DO. Input buffer 7 receives externally applied input data DI. Write circuit 8 amplifies an input data signal to write the resultant signal in a desired memory cell MC. In FIG. 13, a line 100 also indicates a semiconductor substrate.

In reading operation, the X-decoder 2 activates one of word lines WL in response to an externally applied X-address signal XA. A data signal, which is stored in the memory cell MC connected to the activated word line WL, appears on bit lines BLa and BLb. The Y-decoder 3 selects one bit line pair in response to an externally supplied Y-address signal YA. More specifically, one of switch circuits in a Y-gate circuit 4 is rendered conductive in response to an output signal supplied from the Y-decoder 3, and therefore the data signal on one bit line pair is applied to the sense amplifier 5. The applied data signal is amplified by the sense amplifier 5, and then is supplied as the output data DA through the output buffer 6.

In writing operation, input data DI is applied through the input buffer 7 to a write circuit 8. The applied data signal is amplified by the write circuit 8, and then is applied to the gate circuit 4. The Y-decoder 3 sets one of the switch circuits in the gate circuit 4 conductive in response to the Y-address signal YA, and therefore the amplified data signal is applied to the corresponding bit line pair. The X-decoder activates one of the word lines WL in response to the X-address signal XA, and therefore the input data DI is stored in the designated memory cell.

FIG. 14 is a circuit diagram using TFTs. Referring to FIG. 14, the memory cell MC includes PMOS transistors 105 and 106 and MMOS transistors 101 and 102, which form a data storing circuit, as well as NMOS transistors 103 and 104 serving as access gate transistors. The transistors 105 and 106 are formed of the TFTs described before. A source of the driver transistor 101 is connected to a ground line GL through a direct contact resistance R1, which will be described later. Likewise, a source of the driver transistor 102 is connected to a ground line GL through a direct contact resistance R2. The transistors 103 and 104 are connected at their gates to the word line WL.

In writing operation, the bit line (e.g., BLa) attains a high level and the bit line BLb attains a low level and thereafter the word line WL is activated. Since the transistors 103 and 104 are turned on, nodes N1 and N2 of the data storing circuit change to the high and low levels, respectively. In this data stored state, the transistors 102 and 105 are turned on, and the transistors 101 and 106 are turned off.

In reading operation, when the word line WL is activated, a current I flows from a power supply potential Vcc to a ground potential, as shown in FIG. 14. More specifically, the current I flows to the ground line GL through a bit line load transistor 111, access gate transistor 104 and driver transistor 102. In this current path I, there exists the direct contact resistance R2 and an interconnection resistance r, so that a potential of a ground node N4 of the memory cell MC is raised. Thus, during the activation of the word line WL, the current I flows through the memory cell MC toward the ground line GL, whereby the potential of ground node N4 rises.

This current I is referred to as a "column current". Since the column current I is a thousand to a million times as large as the currents flowing through the TFTs 105 and 106, the rise of the potentials of ground nodes N3 and N4 is a remarkable problem particularly in the SRAM.

FIG. 15 is a schematic block diagram of a memory cell array including the memory cells shown in FIG. 14. Referring to FIG. 15, the memory cell array includes memory cells M41'–M78' disposed in rows and columns. Word lines WL1–WL4 are connected to the memory cells in first to fourth rows. The memory cells M41'–M48' and M51'–M58' in the first and second rows are connected to a ground line GL1 through direct contact resistances R. Likewise, the memory cells M61'–M68' and M71'–M78' in the third and fourth rows are connected to the ground line GL2. Each of the ground lines GL1 and GL2 includes the interconnection resistance r. The ground lines GL1 and GL2 are connected to common ground lines GNDLa and GNDLb.

The word lines WL1–WL4 and ground lines GL1 and GL2 extending in a lateral direction in FIG. 15 are formed of polysilicon layers or polycide layers on the semiconductor substrate. Meanwhile, the ground lines GNDLa and GNDLb extending in a longitudinal direction in FIG. 15 are formed of aluminum interconnections. In general, the aluminum has a resistance lower than that of polysilicon and polycide. Therefore, the longitudinal ground lines GNDLa and GNDLb in FIG. 15 are made of aluminum for reducing the resistances of ground lines. Although not shown in FIG. 15, the bit lines are formed of longitudinal aluminum interconnections in FIG. 15.

FIG. 16 shows a layout of the memory cells M62' and M63' of FIG. 15 formed on the semiconductor substrate. In this layout, the transistors 101, 102, 103 and 104 shown in FIG. 14 among the transistors forming the memory cell M62' are depicted. The PMOS transistors 105 and 106 formed of TFTs do not appear in the layout diagram of FIG. 16.

Referring to FIG. 16, the memory cell M62' includes first polysilicon layers 214 and 215, which form the transistors 101 and 102, respectively, as well as first polysilicon layers 212' forming the transistors 103 and 104, respectively. Regions AR surrounded by dashed lines are active regions formed in the semiconductor substrate. A source of the transistor 101 is connected through a direct contact DC2 to the ground line (GL2) formed of a [third] *second* polysilicon layer 230. Likewise, a source of the transistor 102 is connected through a direct contact DC1 to the [third] *second* polysilicon layer 230. Other memory cells M52', M53' and M63' have layouts similar to those of the memory cell M62'.

FIG. 17 is a cross section of a structure including the direct contact DC2 shown in FIG. 16. Referring to FIG. 17, a P-type well 251 is formed on an N-type semiconductor substrate 250. Insulating layers 241 and 242 are formed on the P-type well 251. First polysilicon layers 215 and 216 are formed on the insulating layers 241 and 242, respectively. The first polysilicon layers 215 and 216 are insulated by an insulator 240. A [third] *second* polysilicon layer (i.e., ground line GL2) 230 insulated by the insulator 240 is directly connected to an active region AR1 formed in the P-type well 251. At a contact portion between the [third] *second* polysilicon layer 230 and active region AR1, there exists a resistance, which is referred to as a "direct contact resistance". The direct contact resistances R1 and R2 shown in FIG. 14 and the direct contact resistance R shown in FIG. 15 are caused in this manner, because the ground line is formed of polysilicon.

FIG. 18 is a circuit diagram showing the currents flowing through the ground line GNDLa in the memory cell array in FIG. 15. Referring to FIG. 18, upon activation of the word line WL1, column currents I1–I5 flow from the memory cells M41'–M45' to the ground line GL1, respectively. Each of the currents I1–I5 flows through the corresponding direct contact resistance R and interconnection resistance r to the ground lines GNDLa and GNDLb (=0 volt). As can be seen from FIG. 18, nearer to the end of the ground line GL1, in other words, nearer to the ground line GNDLa, the current flowing through the ground line GL1 increases. Since the ground line GL1 includes the interconnection resistance r, the potentials at respective positions on the ground line GL1 change dependent on the existence of the currents I1–I5.

Thus, as indicated by curve C2 in FIG. 19, the potential VGL1 changes the position by position on the ground line GL1. In particular, as the current flowing through the ground line GL1 increases, the potentials at respective positions on the ground line GL1 rise.

The rise of potentials of the ground line GL1 destroys the data stored in the memory cells. In particular, as can be seen from curve C2 in FIG. 19, the maximum rise of potential is caused at a central portion of the ground line GL1, so that data stored in the memory cells M44' and M45' at the central positions among the memory cells M41'–M48' is particularly liable to be destroyed.

In addition, there is another problem. Referring to FIG. 18 again, the column current supplied, e.g., from the memory cell M42' flows as a current I2 from the right side in the figure in some cases, and also flows as a current I2' from the left side in other cases. When the column current I2 flows from the memory cell M42', a potential VN14 of a common connection node N14 of the memory cells M41' and M42' is expressed by the following expression.

$$VN14=(I1+I2+I3+I4)\cdot 2r+I1\cdot R \quad (1)$$

When the column current I2' flows from the memory cell M42', a potential VN14' of the node N14 is expressed by the following expression.

$$VN14'=(I1+I2+I3+I4)\cdot 2r+(I1+I2')\cdot R \quad (2)$$

For example, it is assumed that each of the column currents I1–I4 is 20 $\mu$A, the direct contact resistance R is 500Ω, and the interconnection resistance r is 20Ω. The potentials VN14 and VN14' in the respective cases are expressed by the following expressions.

$$VN14=1.6\times10^{-2}+1.0\times10^{-1}=0.116V \quad (3)$$

$$VN14'=1.6\times10^{-2}+2.0\times10^{-1}=0.216V \quad (4)$$

As can be seen from the foregoing expressions (1)–(4), when the word line WL1 is activated, the potential of the connection node N14 changes, depending on a state of storage of data in the memory cell M42', which may also destroy data as described before. The changes of potentials VN14 and VN14' are represented by curves C3 and C4 in FIG. 20. In FIG. 20, the ordinate represents the potential, and the abscissa represents positions of nodes N13 and N14.

SUMMARY OF THE INVENTION

An object of the invention is to provide a semiconductor memory device including memory cells connected to a ground line, capable of preventing destruction of data stored in the memory cells.

Another object of the invention is to provide a static random access memory device capable of preventing destruction of data stored in memory cells.

In brief, the semiconductor memory device according to the present invention includes a semiconductor substrate, and a memory cell array including a plurality of memory cells arranged in rows and columns on the substrate. Each memory cell is, including a field effect transistor on the substrate, bounded by first and second ground lines in the column direction. The semiconductor memory device further includes a third ground line formed in the row direction on the substrate and connected to the memory cells, and a word line formed in the row direction on the substrate and connected to the memory cells. A plurality of pairs of successive memory cells connected to the word line are positioned alternately in neighboring rows.

In operation, when one word line is activated, a current from the memory cells connected to the word line flows through the third ground line. Since a plurality of pairs of successive memory cells connected to one word line are positioned alternately in neighboring rows, the number of memory cells making a current flow through the third ground line when one word line is activated, is smaller than that in the conventional circuit. Since a current flowing through the third ground line is decreased compared to the case of the conventional circuit, the rise of potential of the third ground line is suppressed. As a result, destruction of data, which is caused by the rise of potential of the ground line, may be prevented. Moreover, a current from neighboring memory cells in the row direction does not flow through ground nodes of memory cells positioned alternately in neighboring rows. Therefore, the rise of potential of the ground line caused by the current may be prevented.

According to another aspect of the present invention, the semiconductor memory device includes a semiconductor substrate, and a memory cell array including a plurality of memory cells disposed in rows and columns on the substrate. Each memory cell is bounded by first and second ground lines in the column direction. The semiconductor memory device further includes a third ground line formed in the row direction on the substrate and connected to the memory cells, and a word line formed in the row direction on the substrate and connected to the memory cells. As for the successive memory cells connected to the word line, those in the odd numbered columns and those in the even numbered columns are positioned alternately in neighboring rows.

In operation, when one word line is activated, a current from memory cells connected to the word line flows through the third ground line. As for the successive memory cells connected to one word line, those in the odd numbered columns and those in the even numbered columns are positioned alternately in neighboring rows. Therefore, the number of memory cells making a current flow through the third ground line when one word line is activated, is smaller than that of the conventional circuit. Since the current flowing through the third ground line is decreased compared to the conventional circuit, the rise of potential of the third ground line is suppressed. As a result, destruction of data caused by the rise of potential of the ground line can be prevented. In addition, a current from neighboring memory cells in the row direction does not flow through ground nodes of memory cells positioned alternately in neighboring rows. Therefore, the rise of potential of the ground line caused by the current may be prevented.

According to still another aspect of the present invention, the semiconductor memory device includes a semiconductor substrate, and a memory cell array including a plurality of memory cells disposed in rows and columns on the substrate. Each memory cell is bounded by first and second ground lines in the column direction. The semiconductor memory device further includes a word line formed in the row direction on the substrate and connected to the memory cells, and a third ground line formed in the row direction on the substrate and connected to the memory cells. A plurality of pairs of successive memory cells connected to the third ground line are positioned alternately in neighboring rows.

In operation, when one word line is activated, a current from memory cells connected to the word line flows through the third ground line. Since a plurality of pairs of successive memory cells connected to the third ground line are positioned alternately in neighboring rows, the number of memory cells making a current flow through the third ground line when one word line is activated, is smaller than that of the conventional circuit. Since a current flowing through the third ground line is decreased as compared to the case of the conventional circuit, the rise of potential of the third ground line is suppressed. As a result, destruction of data caused by the rise of potential of the ground line may be prevented.

According to a further aspect of the present invention, the semiconductor memory device includes a memory cell array including a plurality of memory cells disposed in rows and columns, a plurality of ground lines each connected to a memory cell in a corresponding row in the memory cell array, and a plurality of oblique word lines each connected to a corresponding memory cell in a diagonal direction in the memory cell array.

In operation, when one oblique word line is activated, a current from the memory cells flows to each of a plurality of ground lines. Therefore, the rise of potential of the ground lines may be prevented.

According to a further aspect of the present invention, the semiconductor memory device includes a semiconductor substrate, and a memory cell array including a plurality of memory cells disposed in rows and columns on the substrate. Each memory cell is bounded by first and second ground lines in the column direction. The semiconductor memory device further includes a third ground line formed in the row direction on the substrate and connected to the memory cells, and a word line formed in the row direction between the first and second ground lines on the substrate and connected to the memory cells. As for the successive memory cells connected to the word line, two successive memory cells at an end portion on the side of the first ground line in the word line are positioned alternately in neighboring rows and two successive memory cells at an end portion on the side of the second ground line in the word line are positioned alternately in neighboring rows.

In operation, when one word line is activated, a current from the memory cells connected to the word line flows through the third ground line. As for the successive memory cells connected to one word line, respective two successive memory cells in end portions on the sides of the first ground line and the second ground line in the word line are positioned alternately in neighboring rows. Memory cells on both ends of the word line have a potential difference between ground nodes on both ends of the memory cell larger than that of the other memory cells. Therefore, a current flowing to ground nodes between the memory cells on both ends of the word line and memory cells neighboring thereto in the row direction from the neighboring memory cells is decreased as compared to the case of the conventional circuit. As a result, the rise of potential of the ground line can be effectively prevented.

According to a further aspect of the present invention, the semiconductor memory device includes a semiconductor substrate, and a memory cell array including a plurality of memory cells disposed in rows and columns on the substrate. Each memory cell is bounded by first and second ground lines in the column direction. The semiconductor memory device further includes first and second word lines formed in the row direction on the substrate and connected to the memory cells, and a third ground line formed in the row direction between the first and second ground lines on the substrate and connected to the memory cells. As for the successive memory cells connected to the third ground line, two successive memory cells at an end portion on the side of the first ground line in the third ground line are positioned alternately in neighboring rows. Two successive memory cells at an end portion on the side of the second ground line in the third ground line are positioned alternately in neighboring rows.

In operation, as for the successive memory cells connected to the third ground line, respective two successive memory cells at end portions on the sides of the first ground line and the second ground line in the third ground line are positioned alternately in neighboring rows. Memory cells on both ends of the word line have a potential difference between ground nodes on both ends of the memory cell larger than that of the other memory cells. A current flowing to ground nodes between the memory cells on both ends and memory cells neighboring thereto in the row direction from the neighboring memory cells is decreased as compared to the case of the conventional circuit. As a result, the rise of potential of the ground line can be effectively prevented.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 16 is a layout of memory cells shown in FIG. 15 on a semiconductor substrate;

FIG. 17 is a cross section of a structure including a direct contact DC2 shown in FIG. 16;

DESCRIPTION OF THE PREFERRED EMBODIMENT

Figure 1:
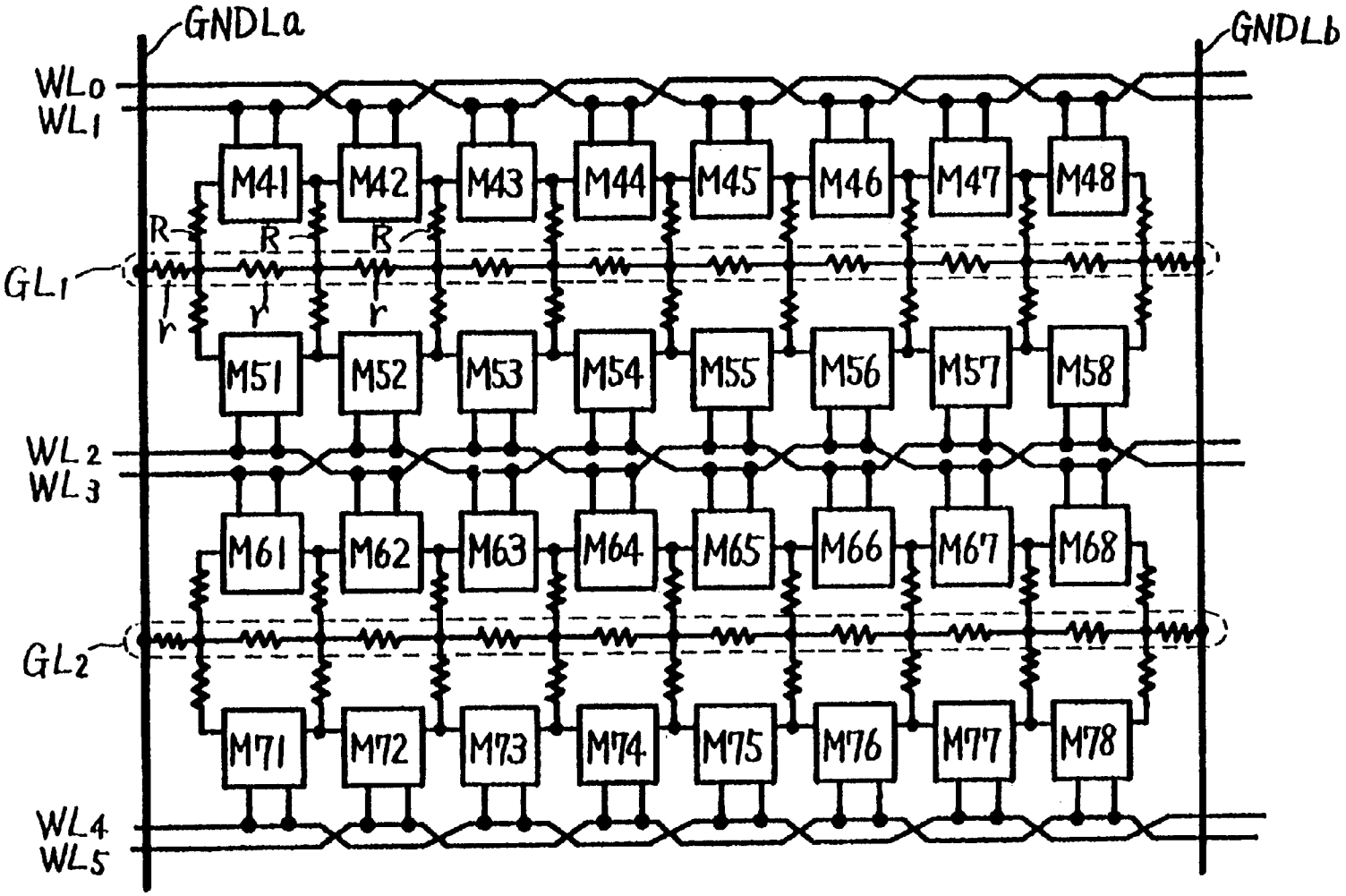
FIG. 1 is a schematic block diagram of a memory cell array of an embodiment of the invention.

Referring to FIG. 1, a memory cell array includes memory cells M41–M78 disposed in rows and columns. The memory cells M41–M48 in one row and the memory cells M51–M58 in another row are connected to a ground line GL1 through a direct contact resistance R. Likewise, the memory cells M61–M68 and M71–M78 are connected to a ground line GL2. The ground lines GL1 and GL2 are formed of a polysilicon layer or a polycide layer on a semiconductor substrate. These ground lines are connected to common ground lines GNDLa and GNDLb made of aluminum.

Figure 15:
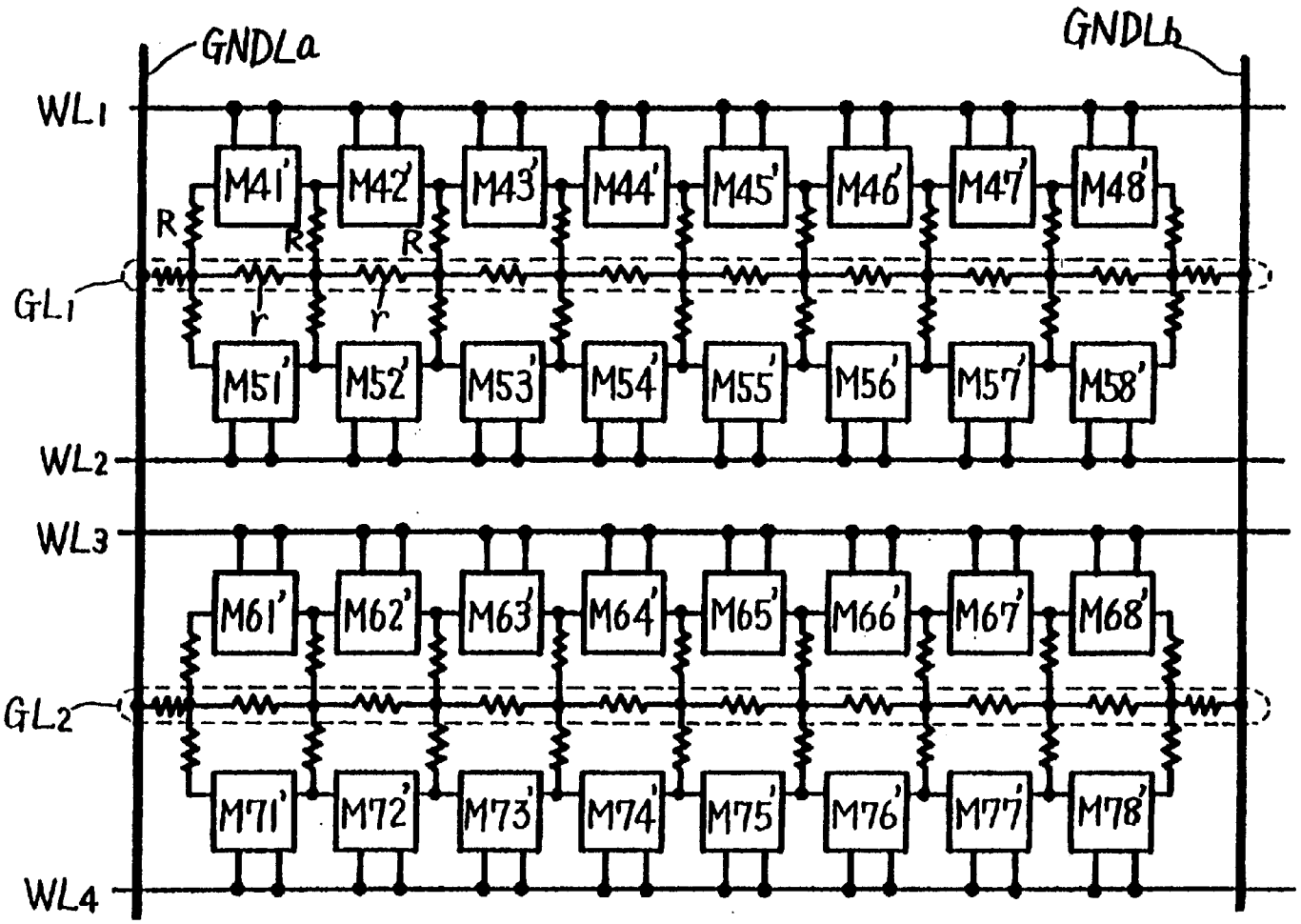
FIG. 15 PRIOR ART
FIG. 15 is a schematic block diagram of a memory cell array including memory cells shown in FIG. 14.

In comparison with the memory cell array in FIG. 15, word lines WL0–WL5 are connected to the memory cells in a fashion different from that in FIG. 15. As shown in FIG. 1, the word lines WL0–WL5 form pairs two by two, and the paired word lines are twisted. For example, the word line WL2 is connected to the memory cells M51, M62, M53, . . . . In a manner complementary to this, the word line WL3 is connected to the memory cells M61, M52, M63, . . . . In other words, the word line WL2 is alternately connected to the memory cells M51–M58 and M61–M68 of the second and third rows. In a fashion complementary to the word line WL2, the word line WL3 is connected alternately to the memory cells M51–M68. More specifically, a plurality of pairs M51 and M62, M53 and M64, . . . , M57 and M68 in successive memory cells M51, M62, M53, . . . , M68 connected to the word line WL2 are positioned alternately in neighboring rows. Similarly, a plurality of pairs M61 and M52, M63 and M54, . . . , M67 and M58 in successive memory cells M61, M52, M63, . . . , M58 connected to the word line WL3 are positioned alternately in neighboring rows. The word lines WL0–WL5 are also formed of the polysilicon layer or polycide layer.

In FIG. 1, paired word lines of the word lines WL0 to WL5 have end portions on the side of the ground line GNDLa not twisted, and end portions on the side of the ground line GNDLb twisted. The present invention is not limited to such an example of FIG. 1. The end portions on the sides of the ground lines GNDLa and GNDLb of the paired word lines may be twisted or not twisted.

Figure 2:
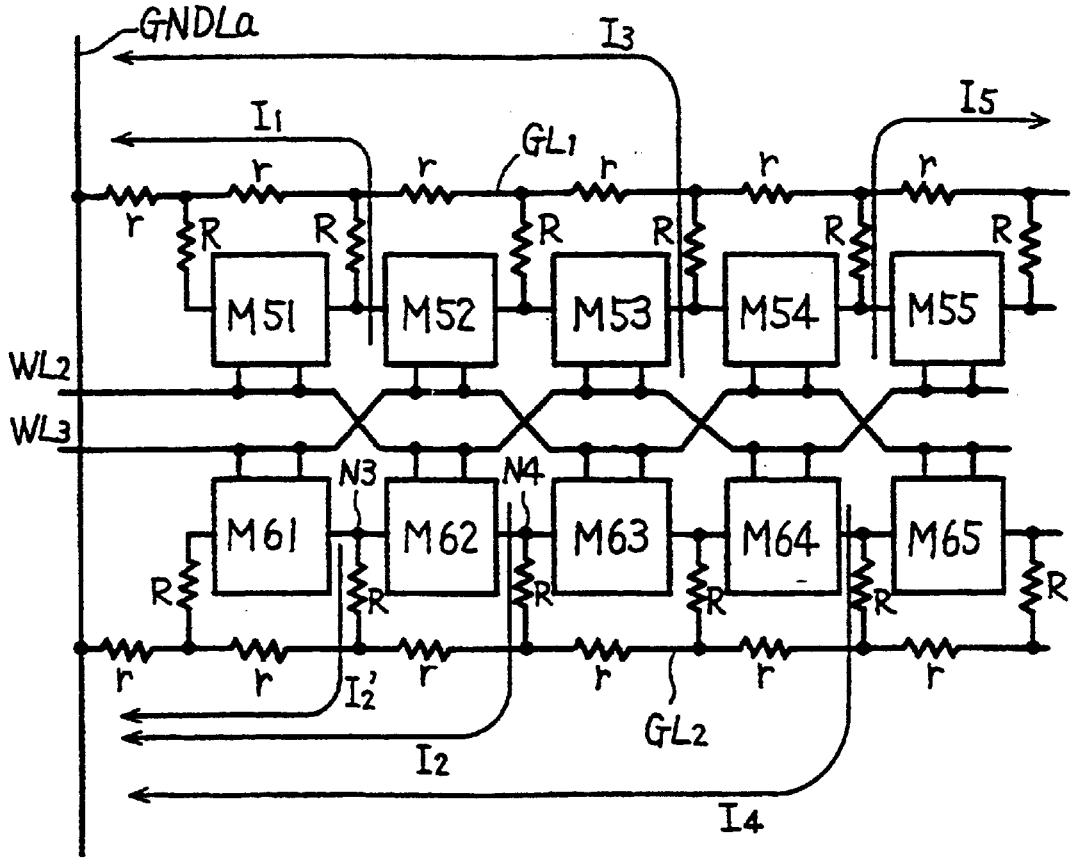
FIG. 2 is a schematic diagram for showing currents flowing through ground lines in a memory cell array shown in FIG. 1.

FIG. 2 is a circuit diagram for showing currents flowing through the ground lines GL1 and GL2 in the memory cell array shown in FIG. 1. In FIG. 2, there are shown the memory cells M51–M55 and M61–M65 in the second and third lines among those in the memory cell array shown in FIG. 1. For example, when the word line WL2 is activated, the memory cells M51, M62, M53, M64, M55,. . . . are accessed. Therefore, column currents I1–I5 flow from the accessed memory cells to the ground lines GL1 and GL2. The currents I1 and I3 among the currents I1–I5 flow through the ground line GL1 to the ground line GNDLa. The currents I2 and I4 flows through the ground line GL2 to the ground line GNDLa. The current I5 flows through the ground line GL1 to the ground line GNDLb (not shown).

As can be seen from FIG. 2, when one of the word lines WL2 is activated, the current flows from the selected memory cell through the two ground lines GL1 and GL2. Therefore, the total of currents flowing through each of the ground lines GL1 and GL2 is smaller than the sum of the current flowing through one ground line GL1 shown in FIG. 18. Therefore, the rise of potentials of the ground lines GL1 and GL2 is half the rise of the potential of the ground line GL1 shown in FIG. 18.

Referring to FIG. 19 again, curve C1 shows the change of potential on the ground line GL1 shown in FIG. 2. As can be seen from the comparison with curve C2 showing the change of potential on the ground line GL1 in FIG. 18, the rise of potential on the ground line GL1 in FIG. 2 is half the rise of potential of the ground line in FIG. 18.

In a memory cell array shown in FIG. 1, when the word line WL2 is activated for the read operation, the potential of the ground line GL1 rises to an extent smaller than that in the memory cell array in FIG. 15, so that destruction of data which may be caused by the rise of potential of the ground line is prevented.

Further, the potential of ground node N4 of the memory cell M62 changes dependent on whether the current (i.e., current I2) flows from the right side of the memory cell M62, or the current (i.e., current I2') flows from the left side of the memory cell M62, in a manner as described below. When the current I2 shown in FIG. 2 flows from the memory cell M62, the potential VN4 of ground node N4 is expressed by the following expression.

$$VN4=(I2+I4)\cdot 3r+I2\cdot R \quad (5)$$

In the case where the current I2' shown in FIG. 2 flows from the memory cell M62, the potential VN4' of ground node N4 is expressed by the following expression.

$$VN4'=I2'\cdot 2r+I4\cdot 3r \quad (6)$$

Figure 3:
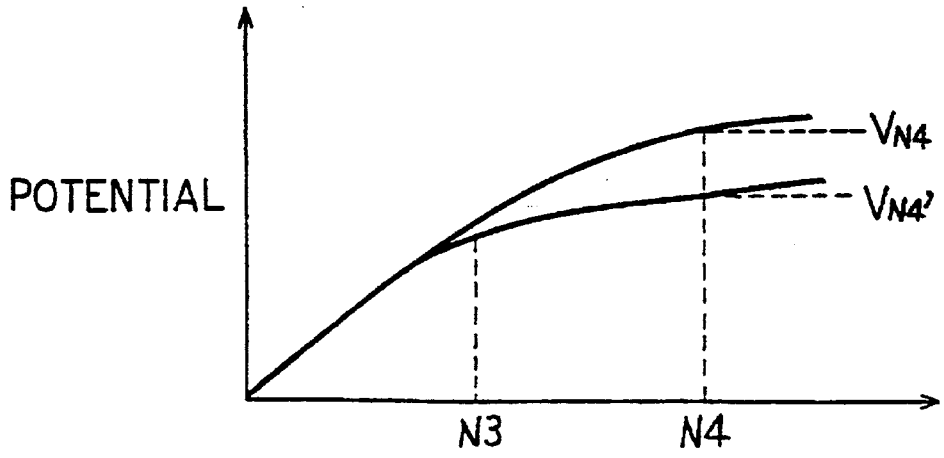
FIG. 3 is a graph showing change of a potential of a ground node N4 shown in FIG. 2.
Figure 18:
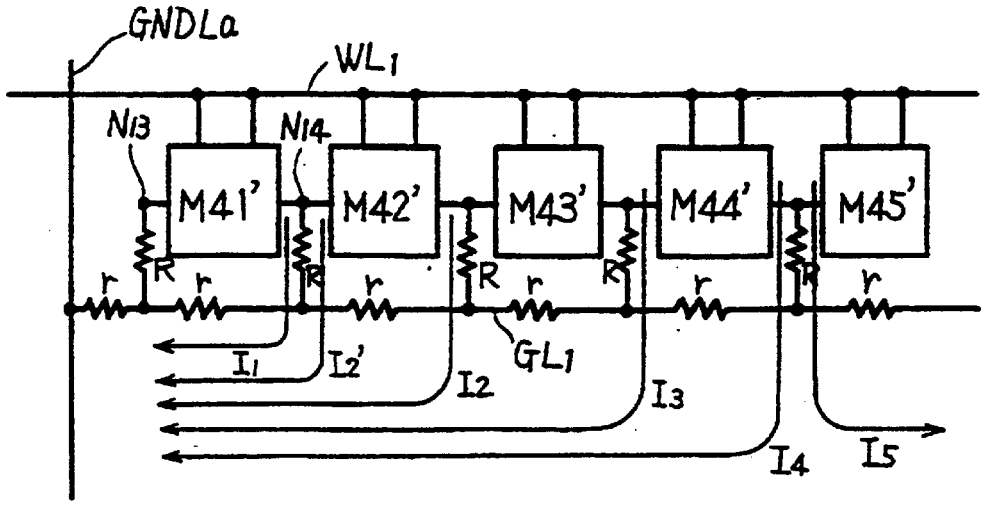
FIG. 18 PRIOR ART
FIG. 18 is a schematic diagram showing currents flowing through a ground line in a memory cell array shown in FIG. 15.

Similarly to the example shown in FIG. 18, assuming that each of the column currents I1–I4 is 200 $\mu$A, the direct contact resistance R is 500Ω, and the interconnection resistance r is 20Ω, then VN4=0.124 volt and VN4'=0.02 volt are obtained from the expressions (5) and (6). As can be seen from the comparison of these values with the values expressed by the expressions (3) and (4), the rise of potential of the ground node N4 in the memory cell M62 can be reduced. The change of potential at the ground node N4 is shown in FIG. 3.

As described above, when the word lines are connected alternately to memory cells in neighboring rows, a circuit of a configuration in which the word lines are connected alternately to memory cells column by column can prevent the most effectively the rise of potential of ground nodes caused by a current flowing from the neighboring memory cells to ground nodes therebetween.

Figure 4:
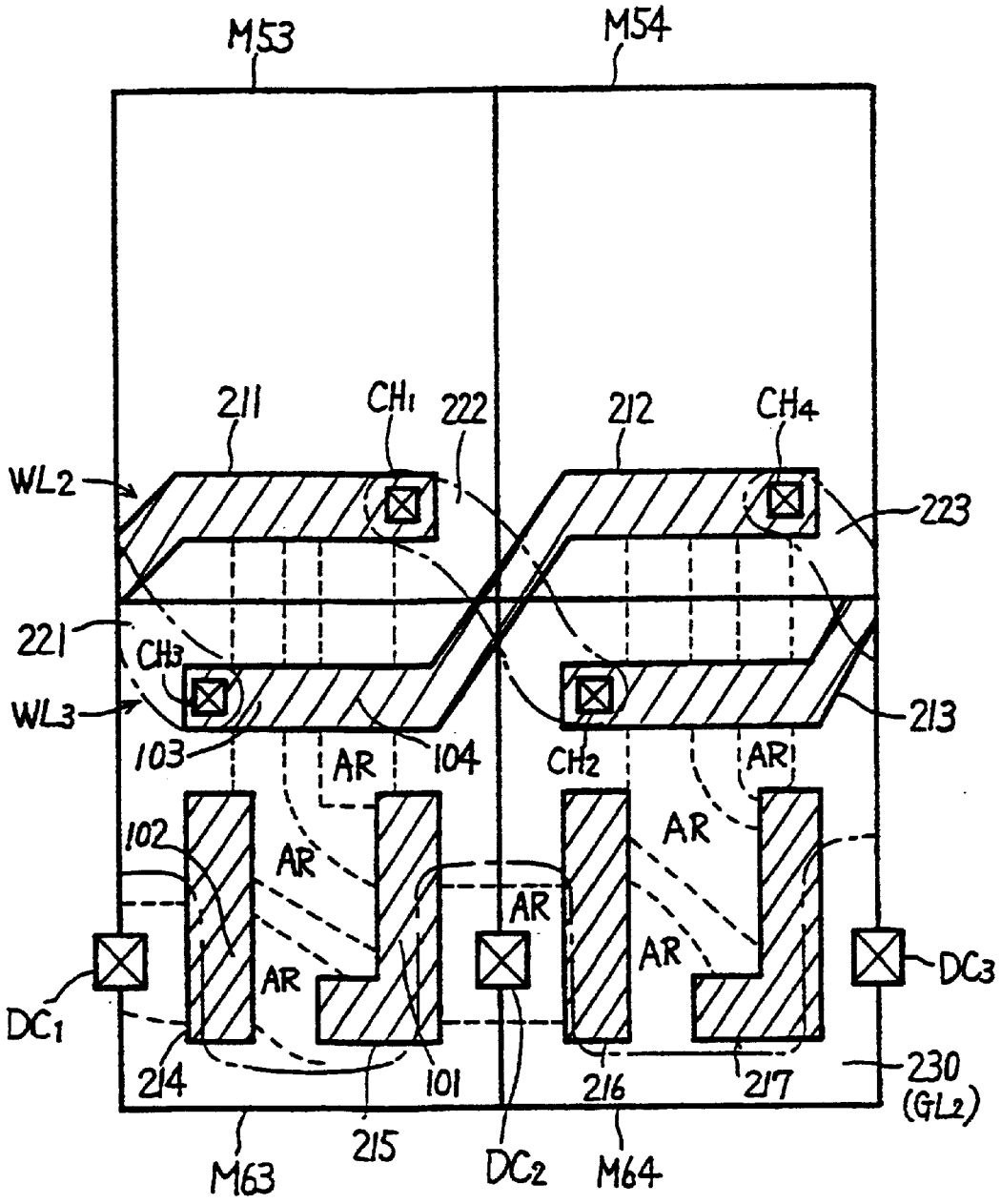
FIG. 4 is a layout of memory cells shown in FIG. 1 on a semiconductor substrate.

FIG. 4 is a diagram showing a layout of the memory cells M63 and M64 shown in FIG. 1 on the semiconductor substrate. In order to connect the word lines WL2 and WL3 alternately to the memory cells column by column, the word lines WL2 and WL3 are formed as shown in FIG. 4 on the semiconductor substrate.

Referring to FIG. 4, the word line WL2 includes a first polycide layer 211, a second polysilicon layer (or second polycide layer) 222 and a first polycide layer 213 which are formed on the semiconductor substrate. The first polycide layer 211 is connected to the second polysilicon layer 222 through a contact hole CH1. The second polysilicon layer 222 is connected to the first polycide layer 213 through a contact hole CH2. The word line WL3 includes a second polysilicon layer 221, a first polycide layer 212 and a second polysilicon layer 223 which are formed on the semiconductor substrate. The second polysilicon layer 221 is connected to the first polycide layer 212 through a contact hole CH3. The first polycide layer 212 is connected to the second polycide layer 223 through a contact hole CH4.

In the layout of FIG. 4, there are shown four transistors 101, 102, 103 and 104 forming one memory cell (e.g., M63). The PMOS transistors 105 and 106 formed of TFTs are not shown on FIG. 4. The driver transistor 101 is formed of a first polycide layer 215. The driver transistor 102 is formed of a first polycide layer 214. The access gate transistors 103 and 104 are formed of the first polycide layer 212. Regions AR represent active regions formed in the semiconductor substrate.

A ground line GL2 is formed of a [third] *second* polysilicon layer (or [third] *second* polycide layer) 230. The [third] *second* polysilicon 230 is connected to the active regions through the direct contacts DC1, DC2 and DC3. Each of the direct contacts DC1–DC3 has the aforementioned direct contact resistance R.

Figure 5:
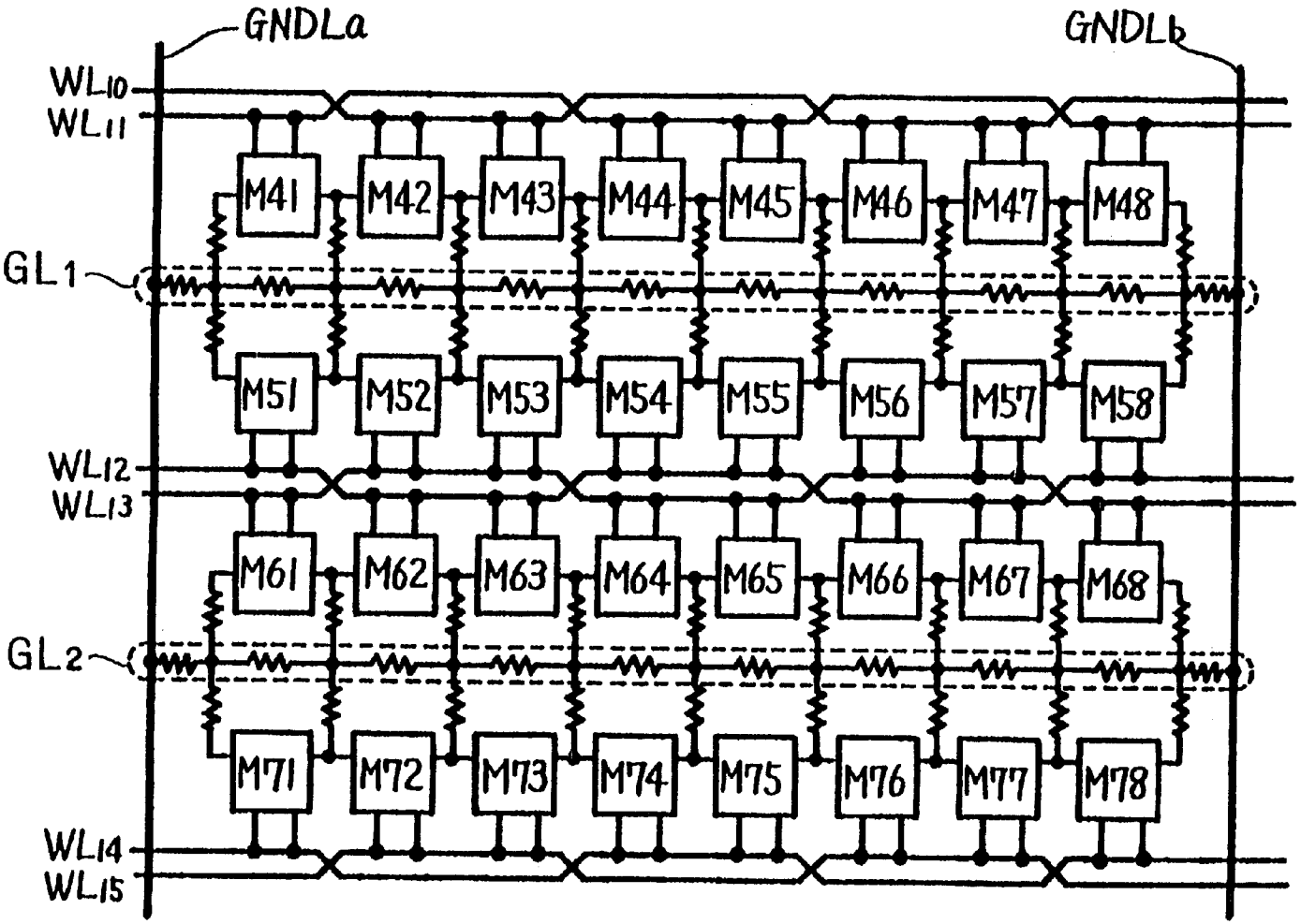
FIG. 5 is a schematic block diagram of a memory cell array of another embodiment of the invention.

FIG. 5 is a schematic block diagram showing another embodiment of the present invention. In the memory cell array shown in FIG. 1, there are provided the word lines each of which is connected alternately to the memory cells of two rows column by column. Meanwhile, in the memory cell array shown in FIG. 5, there are provided word lines WL10–WL15 each having portions connected alternately to the memory cells in two rows, two columns by two columns. More specifically, a plurality of pairs of successive memory cells connected to the word lines WL10 to WL15, respectively, are positioned alternately in neighboring rows. In a specific configuration, the word lines WL10 to WL15 are connected alternately, two columns by two columns, to memory cells excluding memory cells on both ends of each row. The word lines WL10 to WL15 are connected alternately to respective memory cells of one ends of respective rows and respective memory cells neighboring thereto, and alternately connected to respective memory cells on the other ends of respective rows and respective memory cells neighboring thereto. In the embodiment shown in FIG. 5, when one of the word lines is activated, the total of currents flowing from the memory cells to the ground lines is reduced by half, compared with the circuit shown in FIG. 15, so that the rise of potentials of the ground lines can be prevented. Therefore, the destruction of data stored in the memory cells can be prevented also in this embodiment.

In this embodiment, in memory cells in neighboring rows, word lines are connected alternately to memory cells two columns by two columns. Therefore, the effects of suppressing the rise of potential of ground nodes caused by a current flowing from neighboring memory cells to ground nodes therebetween are a little smaller than those of the circuit shown in FIG. 1. However, the effects of suppressing the rise of potential of the ground nodes are larger than the case where word lines are connected alternately to memory cells for every two or more columns.

Figure 19:
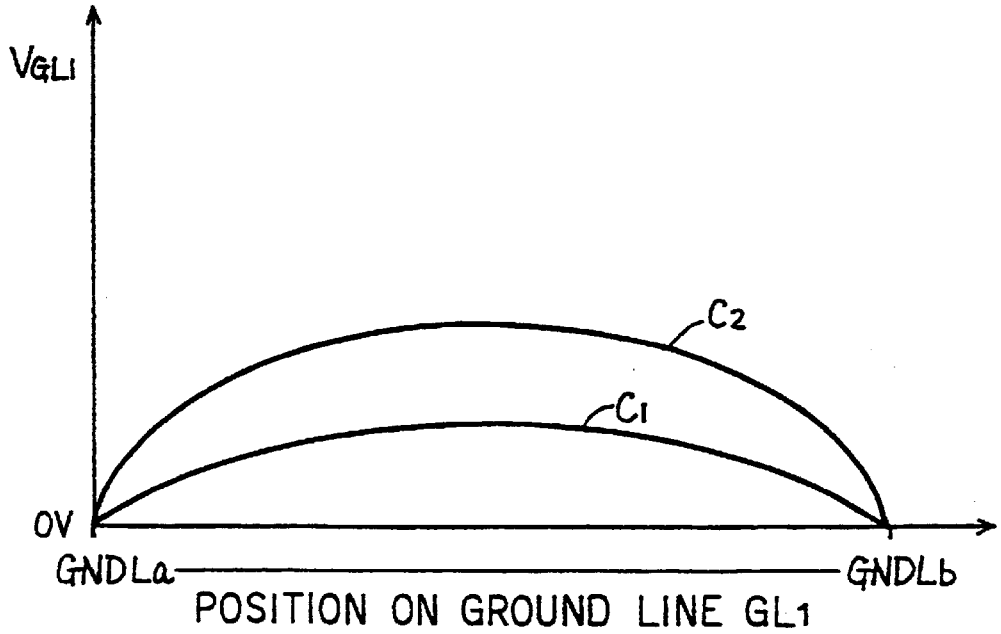
FIG. 19 PRIOR ART
FIG. 19 is a graph showing change of a potential on a ground line shown in FIG. 18.
Figure 20:
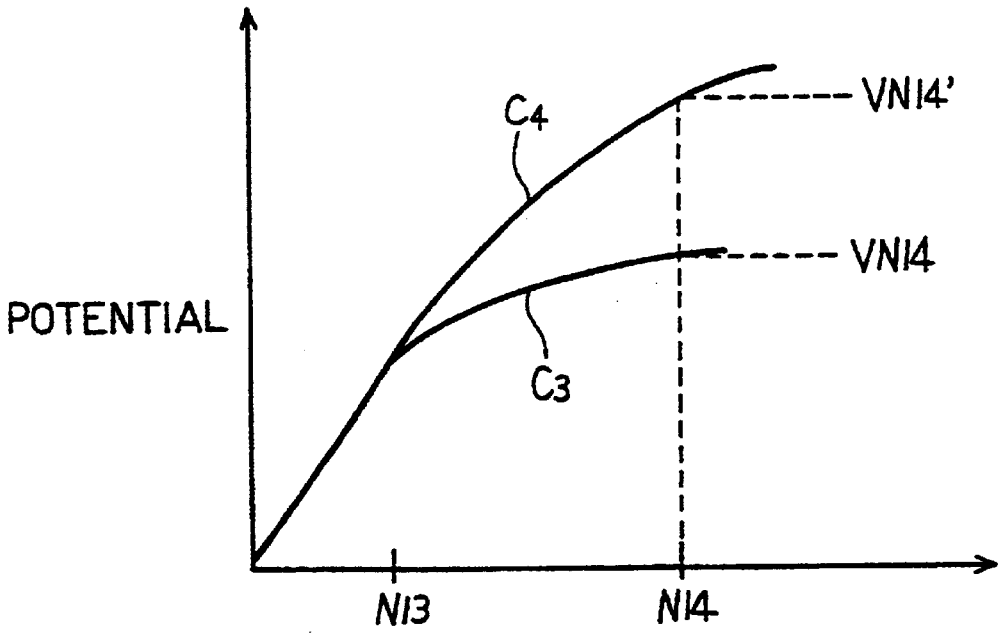
FIG. 20 PRIOR ART
FIG. 20 is a graph showing change of a potential of a ground node N14 shown in FIG. 18.

In addition, the following peculiar effect can be obtained in this embodiment. The effects of suppressing the rise of potential of the ground node as described above can be obtained at ground nodes between memory cells of portions to which word lines are connected alternately in each row. Referring to FIG. 19, memory cells (for example, M41, M48) at respective ends of the ground lines GL1, GL2 have the greatest potential difference between ground nodes on both sides of the memory cell. Therefore, by decreasing the potential difference between ground nodes of memory cells at respective ends of the ground lines GL1, G12, it is possible to effectively suppress the rise of potential of the ground lines GL1, GL2, compared to the case where the potential difference between the ground nodes of other memory cells is decreased.

Focusing on memory cells at respective ends of the ground lines GL1, GL2, the word lines WL10 to WL15 are connected alternately to memory cells at respective ends of the ground line GL1, GL2 and memory cells neighboring thereto. Therefore, the circuit of FIG. 5 can suppress effectively the rise of potential of respective ground lines GL1, GL2, compared to the case where the word lines WL10 to WL15 are not connected alternately to memory cells at respective ends of the ground lines GL1, GL2 and memory cells neighboring thereto.

Figure 6:
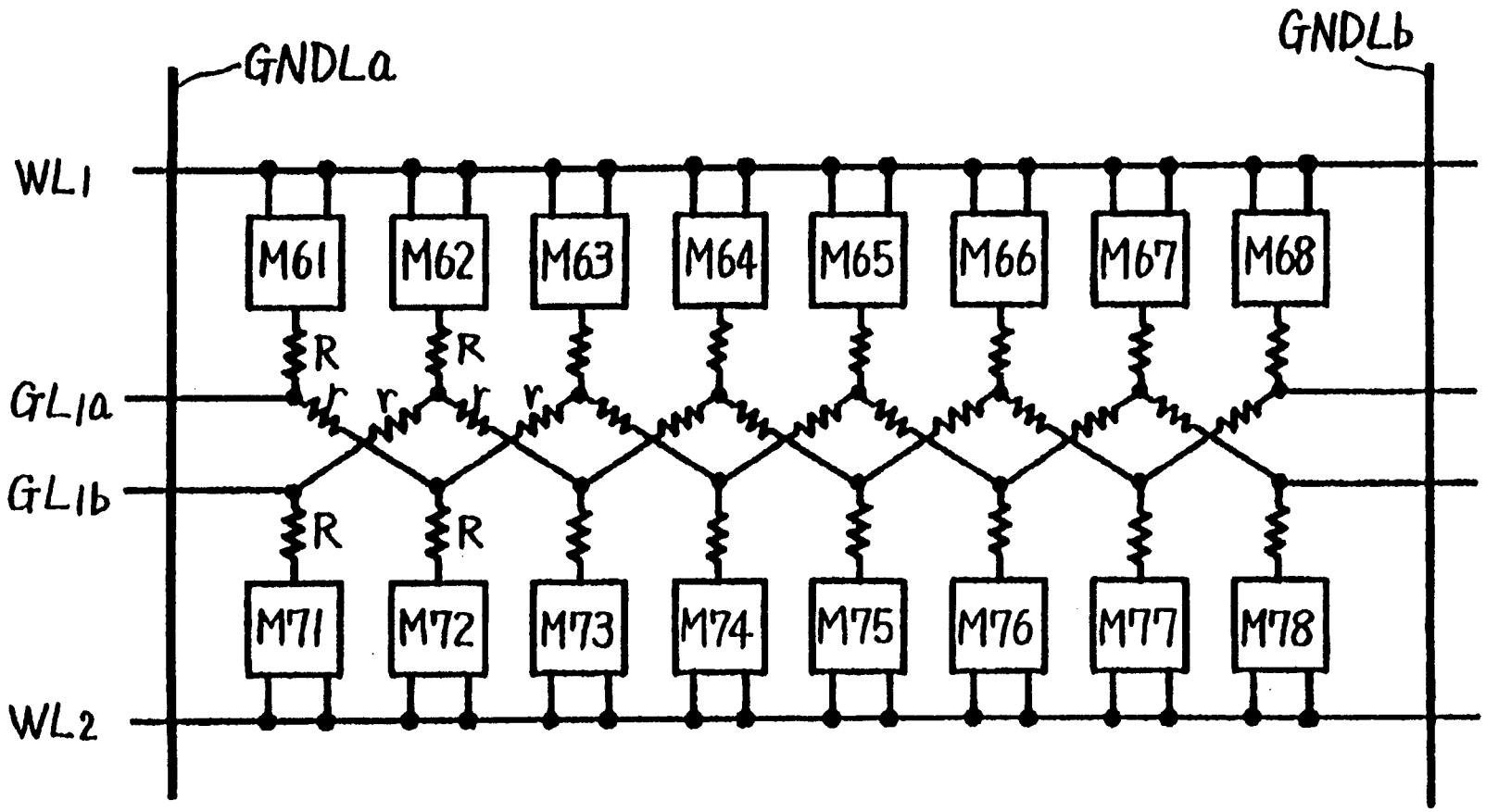
FIG. 6 is a schematic block diagram of a memory cell array of still another embodiment of the invention.

FIG. 6 is a circuit block diagram of a memory cell array showing still further embodiment of the invention. Referring to FIG. 6, there are provided two ground lines GL1a and GL1b instead of one ground line GL1 in the circuit shown in FIG. 15. Each of the ground lines GL1a and GL1b is connected alternately to the memory cells M61–M68 and M71–M78 column by column, respectively. Each memory cell is connected through one contact resistance R to the corresponding one ground line GL1a and the corresponding one ground line GL1b. The ground lines GL1a and GL1b have interconnection resistances r.

Figure 7:
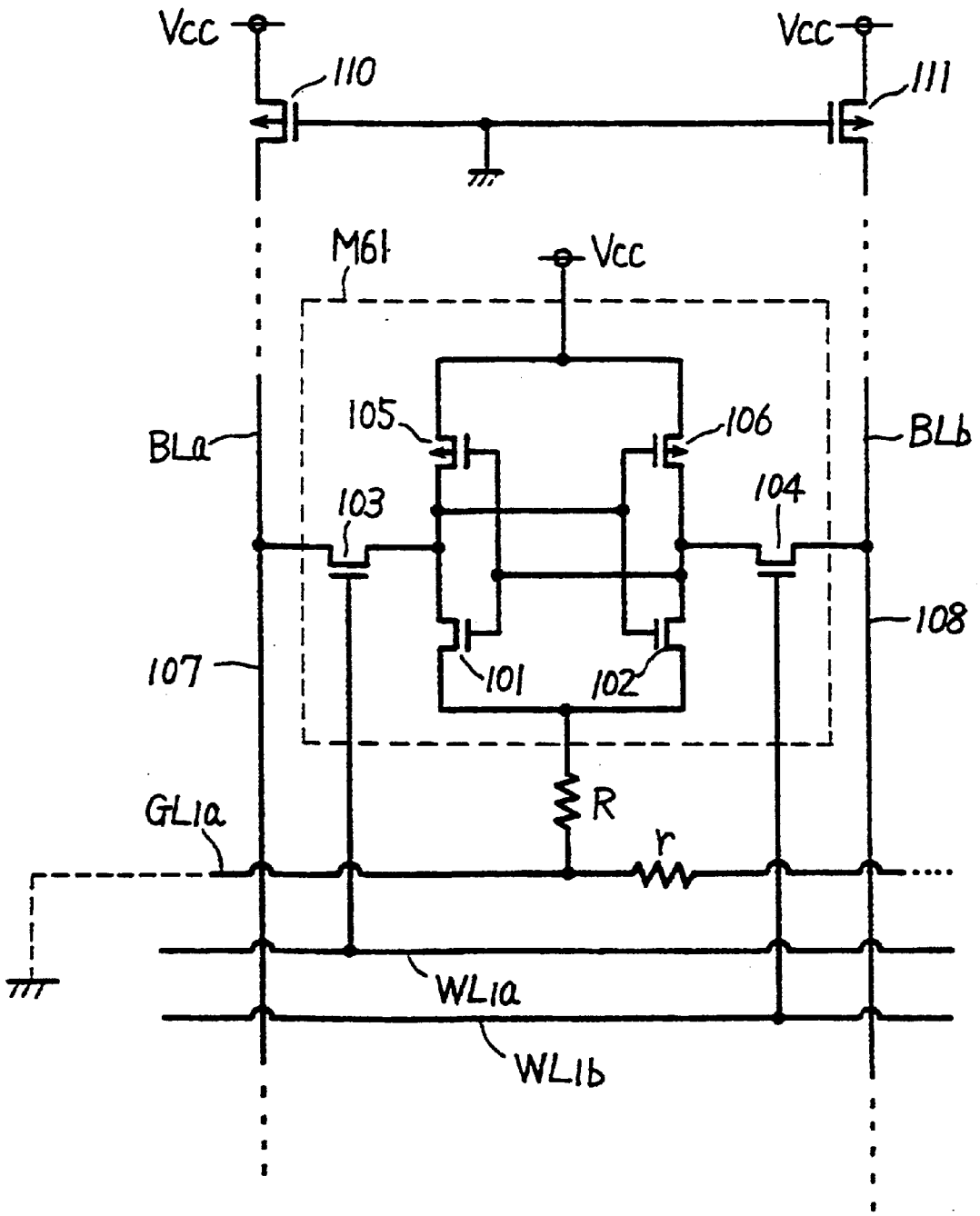
FIG. 7 is a schematic diagram of one memory cell shown in FIG. 6.
Figure 8:
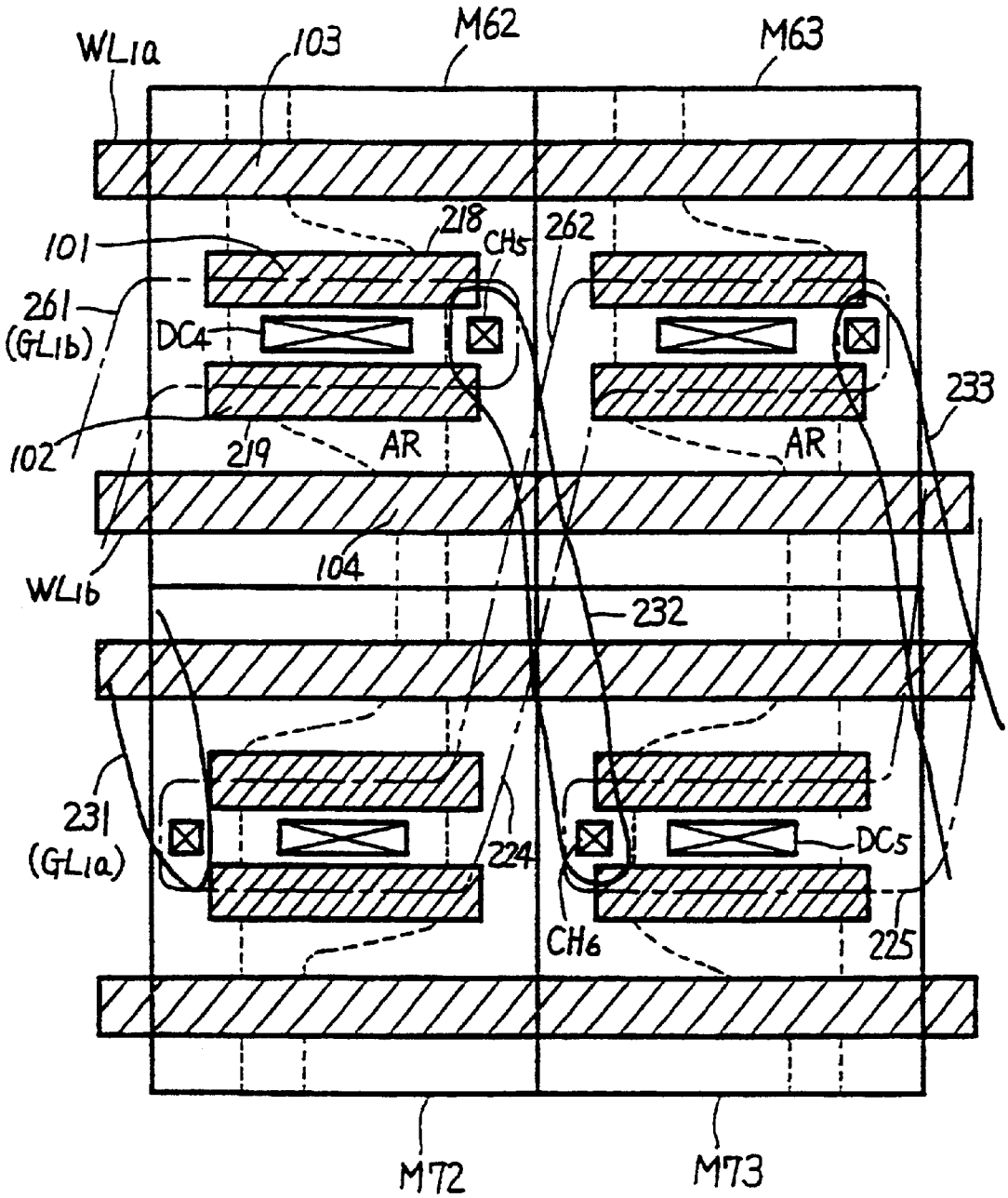
FIG. 8 is a layout of memory cells on a semiconductor substrate shown in FIG. 6.

In the embodiment shown in FIG. 6, one word line WL1 or WL2 is connected to each memory cell. However, in fact, as shown in FIGS. 7 and 8, two word lines WL1a and WL1b, or WL2a and WL2b is connected to each memory cell. Although the row address signal additionally requires one bit for selectively activating the two word lines, symmetry can be obtained in the layout of each memory cell on the semiconductor substrate, as will be described later with reference to a layout in FIG. 8.

When one of the word lines WL1b, for example, is activated, the currents flow from the memory cells M61–M68 through the direct contact R to the ground lines GL1a and GL1b. Also in this embodiment, the total of the column currents flowing through the ground lines GL1a and GL1b is reduced by half, compared with that in the circuit shown in FIG. 15, so that the rise of potential of each of the ground lines GL1a and GL1b is reduced by half. Therefore, the destruction of data stored in the memory cells can be prevented.

FIG. 7 is a circuit diagram of the memory cell M61 shown in FIG. 6. Referring to FIG. 7, gates of the transistors 103 and 104 are connected to the word lines WL1a and WL1b, respectively. Sources of the driver transistors 101 and 102 are connected through the direct contact R to the ground line GL1a.

FIG. 8 is a layout showing the memory cells M62, M63, M72 and M73 on the semiconductor substrate shown in FIG. 6. Referring to FIG. 8, for example, the memory cell M62 includes the driver transistor 101 formed of a first polycide layer 218 and the driver transistor 102 formed of a first polycide layer 219.

A second polysilicon layer (or second polycide layer) 261 forming the ground line GL1b is connected through a direct contact DC4 to the active region, i.e., sources of the transistors 101 and 102. A second polysilicon layer 261 is connected through a contact hole CH5 to a third polysilicon layer (or third polycide layer) 232. The third polysilicon layer 232 is connected to a second polysilicon layer (or second polycide layer) 225 through a contact hole CH6. The third polysilicon layer 225 is connected through a direct contact DC5 to the sources of two driver transistors in the memory cell M73. The ground line GL1a is formed on the semiconductor substrate, similarly to the ground line GL1b.

Each memory cell shown in FIG. 8 has symmetry in its layout on the semiconductor substrate. Referring to FIG. 8, description will be given taking a memory cell 62 as an example. Driver transistors 101 and 102 of the same size are provided symmetrically on the semiconductor substrate with respect to a direct contact DC4. Word lines WL1a and WL1b of the same size are also provided symmetrically on the semiconductor substrate with respect to the direct contact DC4.

In this embodiment, the ground lines GL1a and GL1b are connected alternately to memory cells M61 to M68 and M71 to M78 in two rows. This is because of the following reason. Referring to FIG. 8, the number of word lines in, for example, memory cells M62, M63 is two (the word lines WL1a and WL1b). On the other hand, the number of the ground lines is one in memory cells M62, M63. Therefore, alternate connection of the ground lines is implemented more easily than that of the word line in, for example, memory cells M62, M63.

Comparison of a circuit shown in FIG. 6 and a circuit shown in FIG. 1 leads to the following. In the circuit shown in FIG. 1, word lines are connected alternately to memory cells in two rows. Even memory cells in the same row are connected separately to two word lines. Therefore, an actual arrangement of memory cells as shown in FIGS. 1 and 4 does not match an arrangement of memory cells in the memory space. On the other hand, in the circuit shown in FIG. 6, one word line is connected to all memory cells in the same row. Therefore, an actual arrangement of memory cells shown in FIGS. 6 and 8 matches an arrangement of memory cells in the memory space.

In this embodiment, alternate connection of ground lines for memory cells in two rows as shown in FIG. 6 is not needed. Therefore, it is not necessary to provide ground lines over two layers. Therefore, in this embodiment, ground lines can be formed in one layer, thereby facilitating manufacturing of the circuit.

Figure 9:
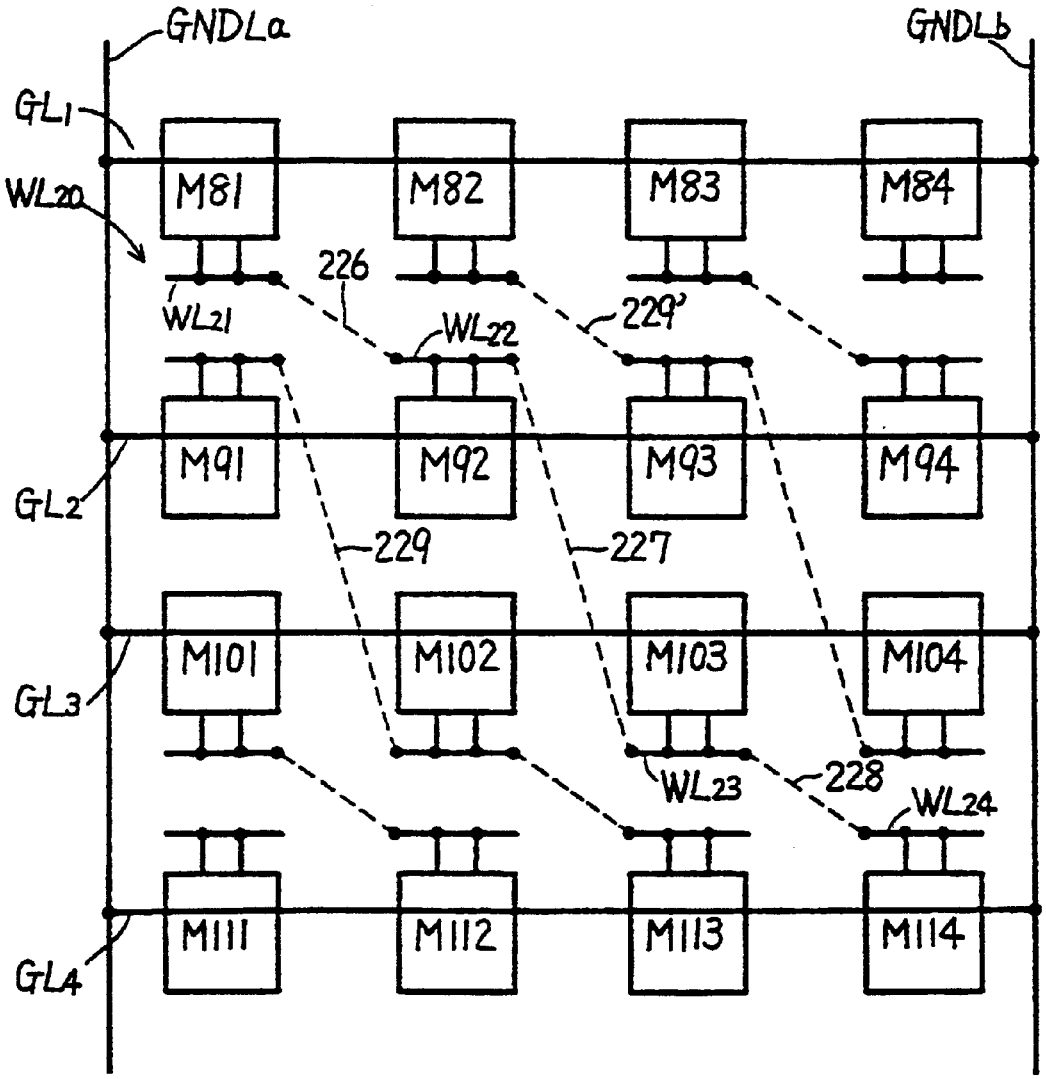
FIG. 9 is a schematic block diagram of a memory cell array of yet another embodiment of the invention.

FIG. 9 is a schematic block diagram of a memory cell array of yet another embodiment of the invention. Referring to FIG. 9, the memory cell array includes memory cells M81–M114 disposed in rows and columns. Each of the ground lines GL1–GL4 is connected to the memory cells in the corresponding row, respectively. In all the embodiments already described, the word lines extend in a lateral direction. In the embodiment in FIG. 9, however, word lines extend substantially obliquely on the semiconductor substrate. Each oblique word line is connected to the memory cells which are aligned in a diagonal direction in the memory cell array, For example, the oblique word line WL20 is formed by connecting local word lines WL21–WL24 to second polysilicon interconnections (or second polycide interconnections) 226–228. The local word lines WL21–WL24 are connected to the corresponding memory cells M81, M92, M103 and M114, respectively. Other oblique word lines in the memory cell array shown in FIG. 9 are formed in the oblique direction on the semiconductor substrate in a fashion similar to the oblique word lines WL20.

When the oblique word line WL20 is activated, the currents flow from the memory cells M81, M92, M103 and Ml14 to the corresponding ground lines GL1, GL2, GL3 and GL4, respectively. Also in this embodiment, the current flowing through one ground line upon activation of one word line (oblique word line) is reduced, so that the rise of potential of the ground line is prevented, and thus the destruction of data stored in the memory cells is prevented.

In this embodiment, in a plurality of memory cells provided in the row direction and connected to one ground line, it is configured that one memory cell is connected to one word line. Therefore, a current flowing through one ground line is decreased as compared to the circuit shown in the other embodiments, and the rise of potential of one ground line is suppressed as compared to the circuit shown in the other embodiments.

Figure 10:
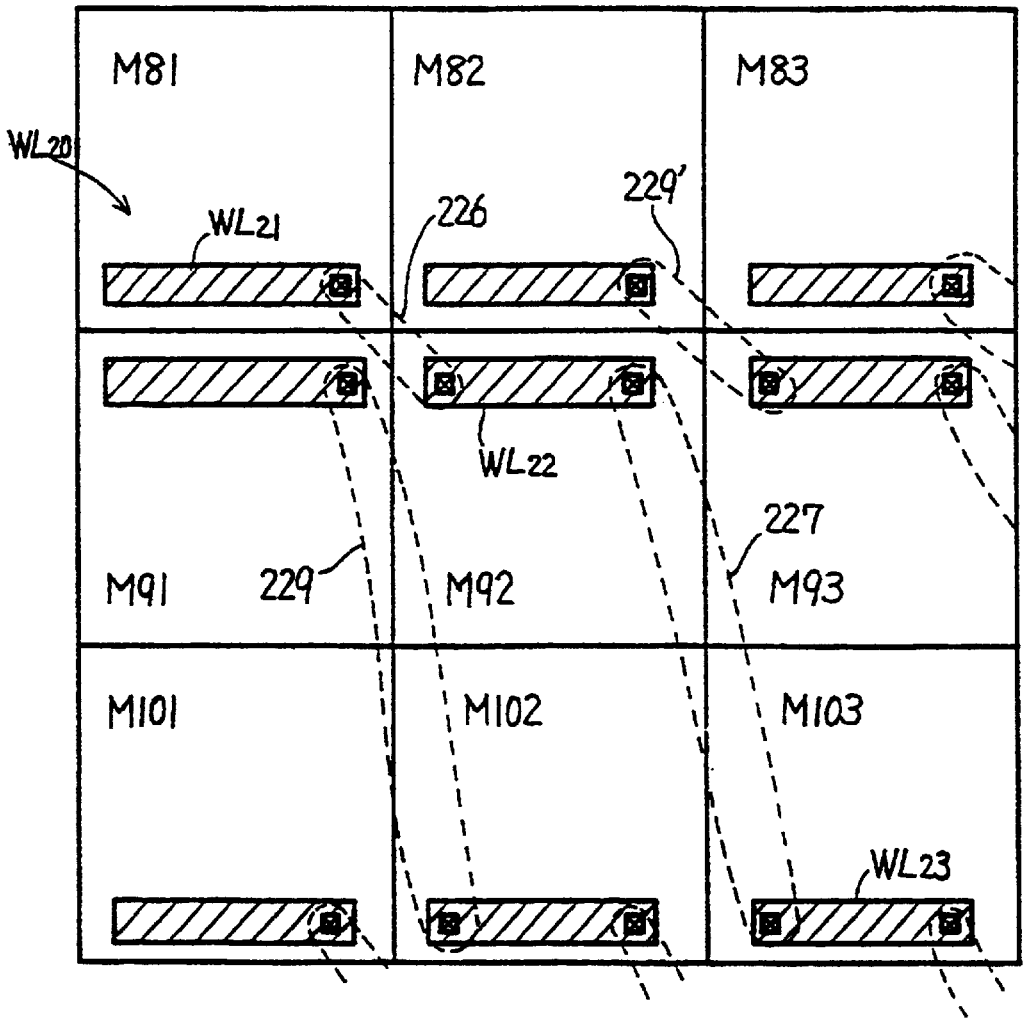
FIG. 10 is a layout of oblique word lines shown in FIG. 9 on a semiconductor substrate.

FIG. 10 is a layout showing the oblique word line WL20 on the semiconductor substrate shown in FIG. 9. Referring to FIG. 10, each of the local word lines WL21, WL22 and WL23 forming the oblique word line WL20 is formed of the first polycide layer on the semiconductor substrate. The local word line WL21 is connected to the local word line WL22 through the second polysilicon layer (or second polycide layer) 226. The local word line WL22 is connected through the second polysilicon layer 227 to the local word lines WL23.

Figure 11:
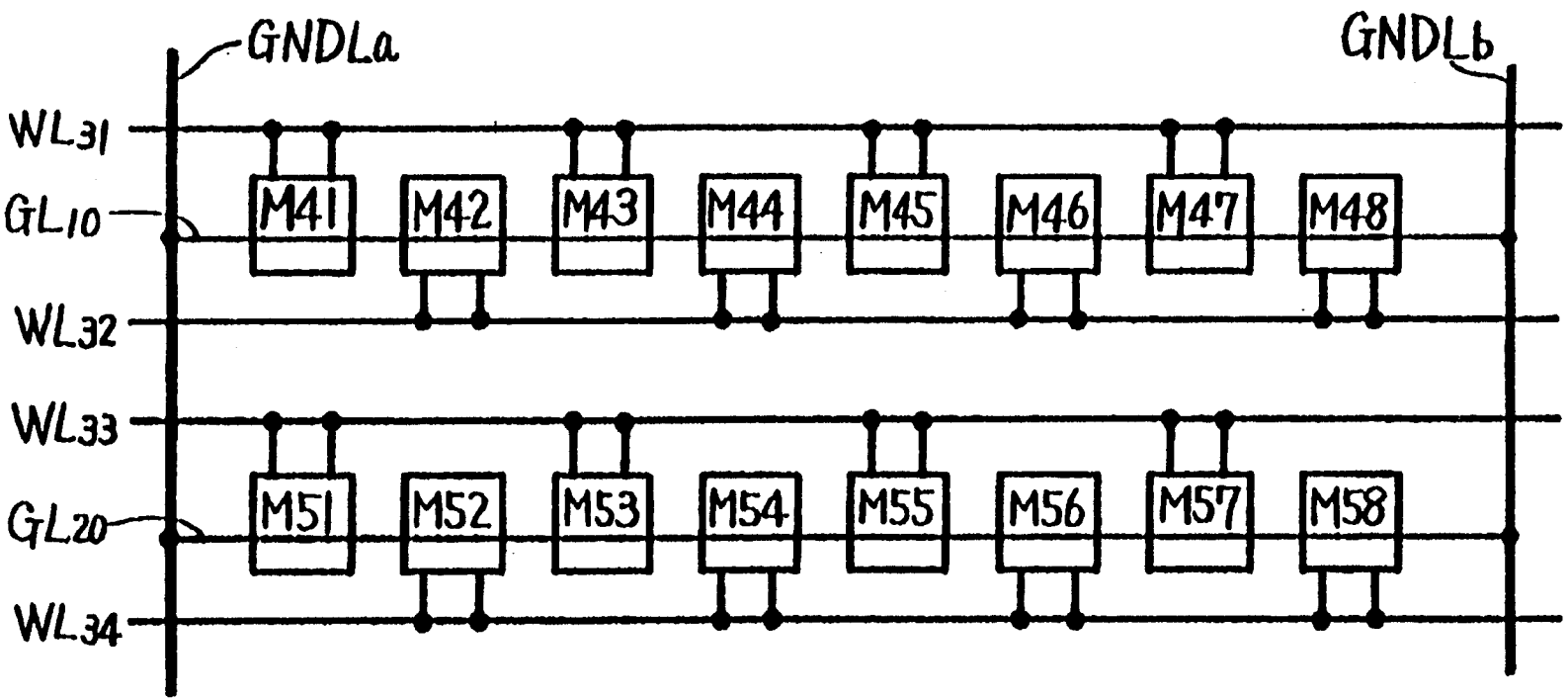
FIG. 11 is a schematic block diagram of a memory cell array of still further embodiment of the invention.

FIG. 11 is a schematic block diagram showing a memory cell array of still further embodiment of the invention. Referring to FIG. 11, the memory cells M41–M48 disposed in the first row are connected to a ground line GL10 through direct contacts (not shown). Likewise, the memory cells M51–M58 disposed in the second row are connected to a ground line GL20. A word line WL31 is connected to odd numbered memory cells among the memory cells M41–M48. A word line WL32 is connected to the even numbered memory cells. Likewise, a word line WL33 is connected to the odd numbered memory cells among the memory cells M51–M58, and a word line WL34 is connected to the even numbered memory cells.

Also in this embodiment, a reduced amount of currents flow from the memory cells connected to one ground line upon activation of one word line, so that the rise of potential of the ground line is prevented, and thus the destruction of data can be prevented. In this embodiment, two word lines are used for the access to the memory cells in one row, so that the row address signal requires additional one bit.

Figure 12:
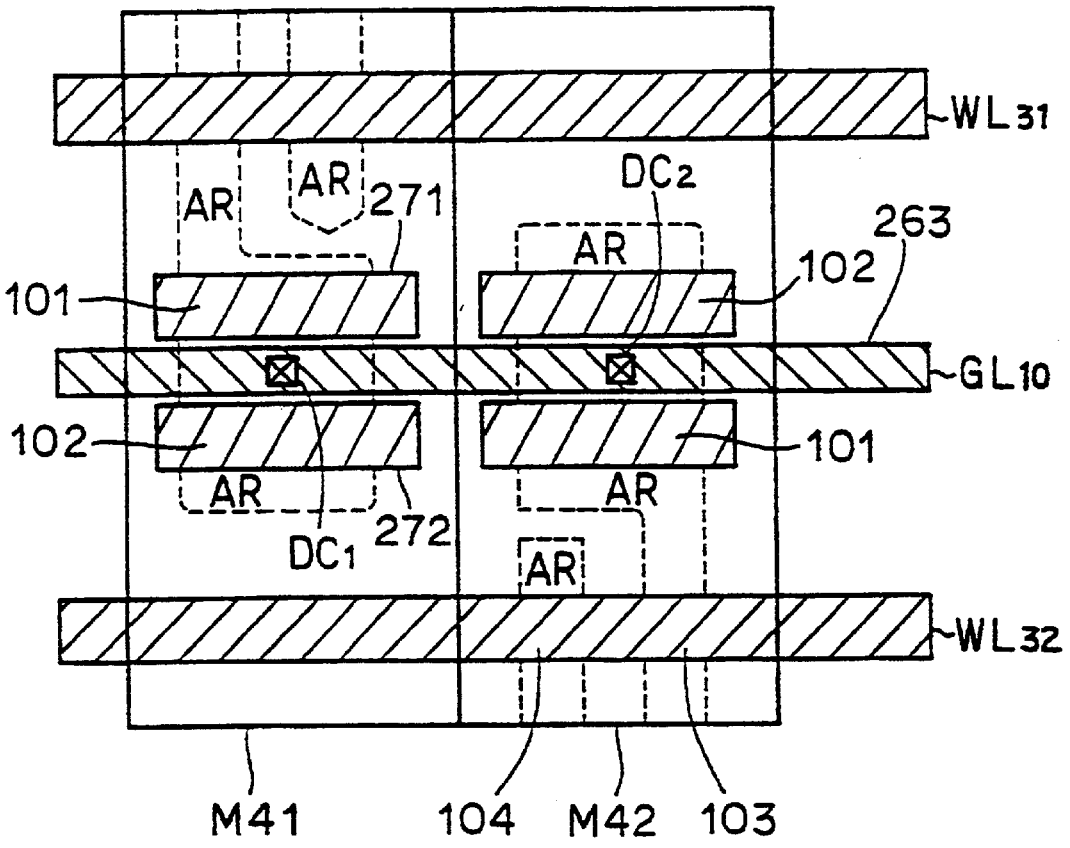
FIG. 12 is a layout of memory cells on a semiconductor substrate shown in FIG. 11.
Figure 13:
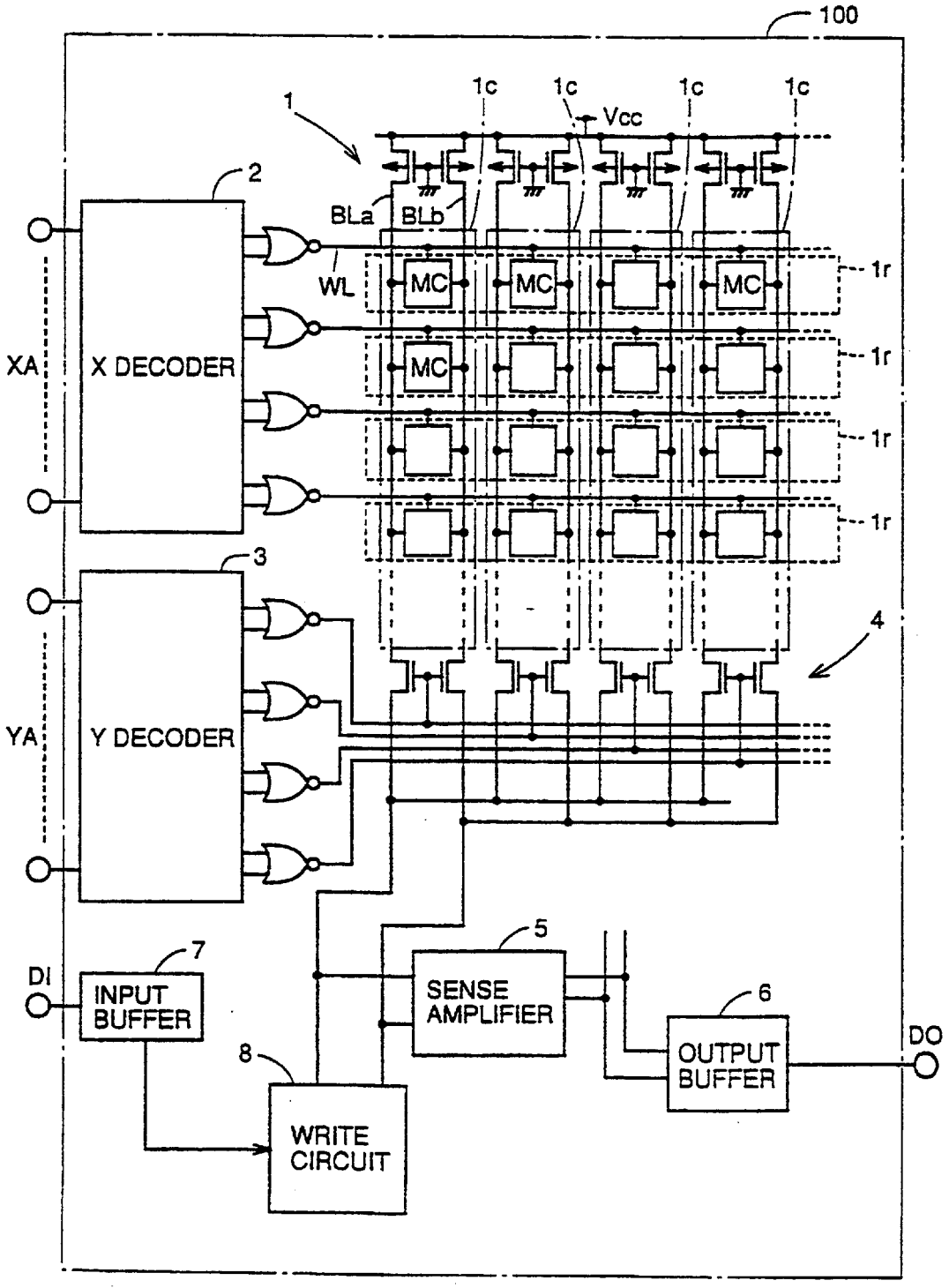
FIG.13 PRIOR ART
FIG. 13 is a block diagram of an SRAM in the prior art.
Figure 14:
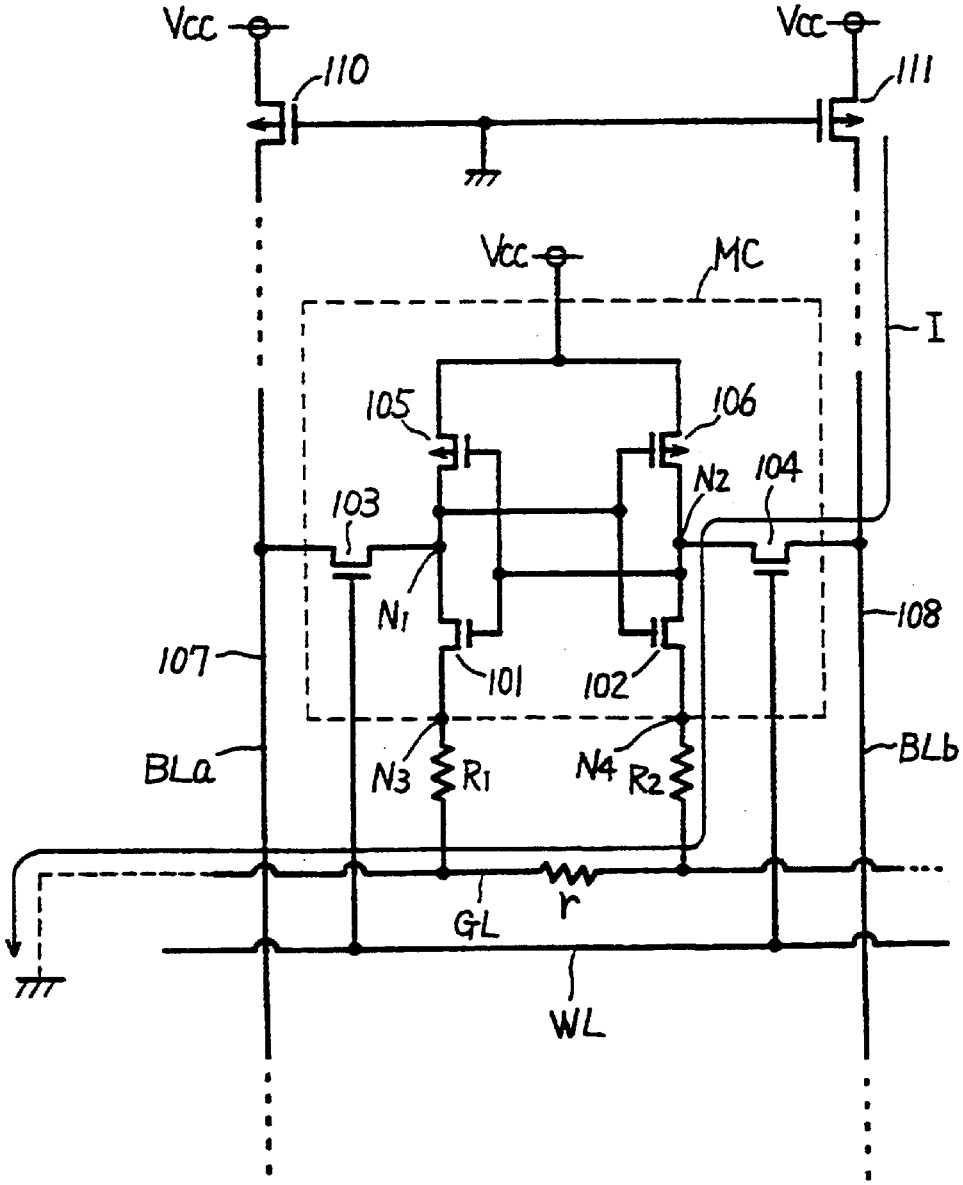
FIG. 14 PRIOR ART
FIG. 14 is a schematic diagram of a memory cell using TFTs.

FIG. 12 is a layout diagram of memory cells M41 and M42 shown in FIG. 11 on the semiconductor substrate. Referring to FIG. 12, the memory cell M41, for example, includes a driver transistor 101 formed of a first polycide layer 271, and a driver transistor 102 formed of a first polycide layer 272.

A second polysilicon layer (or a second polycide layer) 263 constituting a ground line GL10 is connected to an active region AR, that is, the sources of transistors 101 and 102 through a direct contact DC1.

In the embodiments shown in FIGS. 1, 5 and 6, as described hereinabove, the current flows from the memory cell to two ground lines upon activation of one word line. Therefore, the current flowing through one ground line is reduced by half, compared with the circuit shown in FIG. 15, so that the rise of potential of the ground line can be reduced. As a result, the destruction of data, which may be caused by the rise of potential of the ground line, can be prevented. Further, in the embodiment shown in FIG. 9, when one oblique word line is activated, the current flows from the memory cell to multiple ground lines. Therefore, the rise of potentials of the ground lines is prevented, and the destruction of data can be prevented. Also in the embodiment shown in FIG. 11, when one word line is activated, the current flowing from the memory cell to the ground line is reduced by half, so that the destruction of data can be prevented.

Although there have been described the examples in which the invention is applied to the SRAM, it should be noted that the present invention can be generally applied to various semiconductor memories including memory cells connected to ground lines.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

a semiconductor substrate;

a memory cell array including a plurality of memory cells disposed in rows and columns on said substrate, each said memory cell including a field effect transistor on said substrate and being bounded by first and second ground lines in the column direction;

a third ground line formed on the substrate in the row direction and connected to said memory cells; and a word line formed on said substrate in the row direction and connected to said memory cells, plural pairs of successive memory cells connected to said word line being positioned alternately in neighboring rows.

2. The semiconductor memory device as recited in claim 1, wherein said third ground line includes a conductive layer formed on said substrate, said field effect transistor includes active regions formed in said substrate, and said conductive layer is connected to said active regions in said memory cells.

3. The semiconductor memory device as recited in claim 1, wherein said word line is formed in plural, and neighboring word lines cross each other on said substrate.

4. The semiconductor memory device as recited in claim 3, wherein said neighboring word lines include first and second polysilicon interconnections crossing each other on said substrate.

5. The semiconductor memory device as recited in claim 1, wherein said first and second ground lines include grounded metal interconnections and said third ground line has one end connected to said first ground line and the other end connected to said second ground line.

6. The semiconductor memory device as recited in claim 2, wherein said conductive layer includes a third polysilicon interconnection formed on said substrate.

7. The semiconductor memory device as recited in claim 1, wherein plural pairs of successive memory cells connected to said word line are positioned alternately column by column in neighboring rows.

8. The semiconductor memory device as recited in claim 1, wherein plural pairs of successive memory cells connected to said word line are positioned alternately two columns by two columns in neighboring rows.

9. The semiconductor memory device as recited in claim 1, wherein said semiconductor memory device is a static random access memory device.

10. A semiconductor memory device, comprising:

a semiconductor substrate;

a memory cell array including a plurality of memory cells disposed in rows and columns on said substrate, each said memory cell being bounded by first and second ground lines in the column direction;

a third ground line formed on said substrate in the row direction and connected to said memory cells; and a word line formed on said substrate in the row direction and connected to said memory cells, successive memory cells connected to said word line including memory cells in the odd numbered columns and memory cells in the even numbered columns positioned alternately in neighboring rows.

11. A semiconductor memory device, comprising:

a semiconductor substrate;

a memory cell array including a plurality of memory cells disposed in rows and columns on said substrate, each said memory cell being bounded by first and second ground lines in the column direction;

a word line formed on said substrate in the row direction and connected to said memory cells; and a third ground line formed on said substrate in the row direction and connected to said memory cells, plural pairs of successive memory cells connected to said third ground line being positioned alternately in neighboring rows.

12. The semiconductor memory device as recited in claim 11, wherein said third ground line is formed in plural, and neighboring third ground lines cross each other on said substrate.

13. The semiconductor memory device as recited in claim 12, wherein said neighboring third ground lines include first and second conductive layers crossing each other on said substrate.

14. The semiconductor memory device as recited in claim 11, wherein said first and second ground lines include grounded metal interconnections, and said third ground line has one end connected to said first ground line, and the other end connected to said second ground line.

15. A semiconductor memory device, comprising:

a memory cell array including a plurality of memory cells disposed in rows and columns;

a plurality of ground lines each connected to said memory cells in a corresponding row in said memory cell array; and a plurality of oblique word lines each connected to a corresponding memory cell aligned in a diagonal direction in said memory cell array.

16. The semiconductor memory device according to claim 15, wherein each of said oblique word lines includes a plurality of first conductive layers and a plurality of second conductive layers which are disposed alternately to each other and which are connected in series to each other.

17. A semiconductor memory device, comprising:

a semiconductor substrate;

a memory cell array including a plurality of memory cells disposed in rows and columns on said substrate, each said memory cell being bounded by first and second ground lines in the column direction;

a third ground line formed on said substrate in the row direction and connected to said memory cells;

a word line formed between said first and second ground lines on said substrate in the row direction and connected to said memory cells, successive memory cells connected to said word line including two successive memory cells at an end portion on the side of said first ground line in the word line positioned alternately in neighboring rows, and two successive memory cells at an end portion on the side of said second ground line in the word line positioned alternately in neighboring rows.

18. A semiconductor memory device, comprising:

a semiconductor substrate;

a plurality of memory cells disposed in rows and columns on said substrate, each said memory cell being bounded by first and second ground lines in the column direction;

first and second word lines formed on said substrate in the row direction and connected to said memory cells; and a third ground line formed on said substrate in the row direction and connected to said memory cells, successive memory cells connected to said third ground line including two successive memory cells at an end portion on the side of said first ground line in the third ground line positioned alternately in neighboring rows, and two successive memory cells at an end portion on the side of said second ground line in the third ground line positioned alternately in neighboring rows.

*19. A semiconductor memory device including two adjacent memory cells, comprising:*

*a semiconductor substrate;*

*a first conductive layer formed on said substrate;*

*a first and a second access transistor, each having a gate formed from said first conductive layer;*

*a first and a second driver transistor, each having an active region formed in said substrate;*

*an insulating layer formed on said first and second access transistor gates and said first and second driver transistor active regions, said insulating layer having a first and a second contact hole therein to expose said first and second access transistor gates, respectively, and a third contact hole to expose said first and second driver transistor active regions;*

*a second conductive layer formed on said insulating layer;*

*a first and a second word line formed from said second conductive layer, said first word line being connected to said first access transistor gate through said first contact hole, and said second word line being connected to said second access transistor gate through said second contact hole; and*

*a ground line formed from said second conductive layer, said ground line being connected to said driver transistor active regions through said third contact hole.*

*20. A semiconductor memory device according to claim 19, further comprising:*

*first and second driver transistor gates, wherein said first and second driver transistor gates are formed perpendicular to said first and second access transistor gates, respectively.*

*21. A semiconductor memory device according to claim 19, further comprising first and second load elements.*

*22. A semiconductor memory device according to claim 21, wherein said first and second load elements are PMOS transistors.*

*23. A semiconductor memory device according to claim 19, wherein said first and second access transistor gates are formed from polycide.*

*24. A semiconductor memory device according to claim 20, wherein said first and second driver transistor gates are formed from polycide.*

*25. A semiconductor memory device including a memory cell, comprising:*

*a semiconductor substrate;*

*a first conductive layer formed on said substrate;*

*a first and a second access transistor each having a sate formed from said first conductive layer;*

*a first and a second driver transistor, each having an active region formed in said substrate;*

*an insulating layer formed on said first and second access transistor gates and said first and second driver transistor active regions;*

*said insulating layer having a first contact hole therein to expose said first access transistor gate and a second contact hole therein to expose said first driver transistor active region;*

*a second conductive layer formed on said insulating layer;*

*a word line formed from said second conductive layer, said word line being connected to said first access transistor gate through said contact hole; and*

*a ground line formed from said second conductive layer, said ground line being connected to said first driver transistor active region through said second contact hole.*

*26. A semiconductor memory device according to claim 25, further comprising:*

*first and second driver transistor gates, wherein said first and second driver transistor gates are formed perpendicular to said first and second access transistor gates, respectively.*

*27. A semiconductor memory device according to claim 25, further comprising first and second load elements.*

*28. A semiconductor memory device according to claim 27, wherein said first and second load elements are PMOS transistors.*

*29. A semiconductor memory device according to claim 25, wherein said first and second access transistor gates are formed from polycide.*

*30. A semiconductor memory device according to claim 26, wherein said first and second driver transistor gates are formed from polycide.*

*31. A semiconductor memory device including a memory cell, comprising:*

*a semiconductor substrate;*

*a first polysilicon layer formed on said substrate and acting as an access transistor gate;*

*a driver transistor having an active region formed in said substrate;*

*an insulating layer formed on said first polysilicon layer and said driver transistor active region, and having a first contact hole therein to expose said first polysilicon layer and a second contact hole therein to expose said driver transistor active region;*

*a second polysilicon layer formed on said insulating layer and acting as a word line, said second polysilicon layer being is connected to said first polysilicon layer through said first contact hole; and*

*a ground line formed from said second polysilicon layer, said ground line being connected to said driver transistor active region through said second contact hole.*

*32. The semiconductor memory device according to claim 31, further comprising:*

*another first polysilicon layer formed on said substrate and acting as a driver transistor gate.*

*33. A static random access memory including a memory cell comprising:*

*a semiconductor substrate;*

*a first polysilicon layer formed on said substrate and acting as an access transistor gate;*

*a driver transistor having an active region formed in said substrate;*

*an insulating layer formed on said first polysilicon layer and said driver transistor active region, and having a first contact hole therein to expose said first polysilicon layer and a second contact hole therein to expose said driver transistor active region;*

*a second polysilicon layer formed on said insulating layer and acting as a word line, said second polysilicon layer being connected to said first polysilicon layer through said first contact hole; and*

*a ground line formed from said second polysilicon layer, said ground line being connected to said driver transistor active region through said second contact hole.*

*34. The static random access memory according to claim 33, further comprising:*

*another first polysilicon layer formed on said substrate and acting as a driver transistor gate.*

* * * * *